US012803502B2

(12) United States Patent
Hoversten et al.

(10) Patent No.: US 12,803,502 B2
(45) Date of Patent: Nov. 17, 2026

(54) SUPPLY MODULATION TRANSMITTER WITH SWITCH NETWORK

(71) Applicant: Murata Manufacturing Co., Ltd., Kyoto (JP)

(72) Inventors: John R. Hoversten, Arlington, MA (US); David J. Perreault, Cambridge, MA (US); Yevgeniy A. Tkachenko, Belmont, MA (US)

(73) Assignee: Murata Manufacturing Co., Ltd., Kyoto (JP)

( * ) Notice: Subject to any disclaimer, the term of this patent is extended or adjusted under 35 U.S.C. 154(b) by 816 days.

(21) Appl. No.: 18/048,075

(22) Filed: Oct. 20, 2022

(65) Prior Publication Data

US 2023/0054485 A1 Feb. 23, 2023

Related U.S. Application Data

(63) Continuation-in-part of application No. 17/216,919, filed on Mar. 30, 2021, now Pat. No. 11,757,410, (Continued)

(51) Int. Cl.

| | |
|---|---|
| ***H03F 1/02*** | (2006.01) |
| ***H03F 1/32*** | (2006.01) |
| ***H03F 3/19*** | (2006.01) |

(52) U.S. Cl.

CPC ............. *H03F 1/0216* (2013.01); *H03F 1/32* (2013.01); *H03F 3/19* (2013.01); *H03F 1/0211* (2013.01);

(Continued)

(58) Field of Classification Search

CPC . H03F 1/0216; H03F 1/32; H03F 3/19; H03F 1/0211; H03F 1/0244;

(Continued)

(56) References Cited

U.S. PATENT DOCUMENTS

| | | | | |
|---|---|---|---|---|
| 3,517,299 A | | 6/1970 | Corry | |
| 3,718,873 A | * | 2/1973 | Saragourtz .............. | H01P 1/185 333/167 |

(Continued)

FOREIGN PATENT DOCUMENTS

| | | |
|---|---|---|
| CN | 1825757 A | 8/2006 |
| CN | 103873007 A | 6/2014 |

(Continued)

OTHER PUBLICATIONS

Response to U.S. Office Action dated Feb. 24, 2023 for U.S. Appl. No. 17/216,919, filed Apr. 12, 2023; 6 pages.

(Continued)

*Primary Examiner* — Khanh V Nguyen

(74) *Attorney, Agent, or Firm* — Daly, Crowley, Mofford & Durkee, LLP

(57) ABSTRACT

A power supply modulator circuit includes a multi-output power supply that generates multiple power output signals; at least one power modulator circuit generates a modulated power output signal from the multiple power output signals of the multi-output power supply; at least one pulse shaping network (PSN) having at least one passive element, the PSN configured to shape the modulated power output signal; at least one power amplifier coupled to receive the modulated power signal; and a switching network having a plurality of switches to create or modify power signal paths from the at least one power modulator circuit to the at least one power amplifier.

10 Claims, 21 Drawing Sheets

Related U.S. Application Data which is a continuation of application No. 16/369,667, filed on Mar. 29, 2019, now Pat. No. 10,992,265.

(52) U.S. Cl.
CPC ...... *H03F 1/0244* (2013.01); *H03F 2200/165* (2013.01); *H03F 2200/451* (2013.01)

(58) Field of Classification Search
CPC ......... H03F 2200/165; H03F 2200/451; H03F 3/245; H03F 1/0227; H03F 3/04; H03F 2200/504; H03G 3/3042; H03G 3/004; H03G 3/3047; H03G 3/3036
USPC ......................... 330/127, 129, 134, 279, 297
See application file for complete search history.

(56) References Cited

U.S. PATENT DOCUMENTS 5,519,349 A * 5/1996 Nakahara ............... H03H 11/20 327/554
5,710,520 A 1/1998 Frey
6,658,053 B1 12/2003 Aiello et al.
7,103,114 B1 9/2006 Lapierre
7,126,442 B2 * 10/2006 Nakajima ................ H03H 7/20 333/156
7,482,869 B2 1/2009 Wilson
7,746,041 B2 6/2010 Xu et al.
7,777,459 B2 8/2010 Williams
7,782,027 B2 8/2010 Williams
7,786,712 B2 8/2010 Williams
7,812,579 B2 10/2010 Williams
7,977,927 B2 7/2011 Williams
8,026,763 B2 9/2011 Dawson et al.
8,164,384 B2 4/2012 Dawson et al.
8,212,541 B2 7/2012 Perreault et al.
8,633,766 B2 1/2014 Khlat et al.
8,786,373 B2 7/2014 Presti et al.
8,824,978 B2 9/2014 Briffa et al.
8,829,993 B2 9/2014 Briffa et al.
8,830,709 B2 9/2014 Perreault et al.
8,830,710 B2 9/2014 Perreault et al.
8,860,396 B2 10/2014 Giuliano
8,957,727 B2 2/2015 Dawson et al.
9,020,453 B2 4/2015 Briffa et al.
9,160,287 B2 10/2015 Briffa et al.
9,166,536 B2 10/2015 Briffa et al.
9,166,640 B2 10/2015 Bakalski
9,172,336 B2 10/2015 Briffa et al.
9,203,346 B2 12/2015 Irvine et al.
9,203,347 B2 12/2015 Jiang et al.
9,209,758 B2 12/2015 Briffa et al.
9,344,304 B1 5/2016 Cohen
9,438,172 B2 9/2016 Cohen
9,479,126 B2 * 10/2016 Ilkov ....................... H03F 1/565
9,490,752 B2 11/2016 Briffa et al.
9,496,828 B2 11/2016 Ye
9,515,621 B2 12/2016 Hietala et al.
9,531,291 B2 12/2016 Perreault
9,537,456 B2 1/2017 Briffa et al.
9,590,565 B2 3/2017 Yuzurihara et al.
9,634,577 B2 4/2017 Perreault
9,668,215 B2 * 5/2017 Balteanu .................. H04B 1/40
9,755,672 B2 9/2017 Perreault et al.
9,768,731 B2 9/2017 Perreault et al.
9,768,732 B2 9/2017 Briffa et al.
9,843,260 B1 12/2017 Paek et al.
9,917,517 B1 3/2018 Jiang et al.
9,979,421 B2 5/2018 Astrom et al.
9,991,043 B2 6/2018 Andres et al.
9,991,913 B1 6/2018 Dinur et al.
10,038,461 B2 7/2018 Briffa et al.
10,090,808 B1 10/2018 Henzler et al.
10,148,227 B2 12/2018 Leipold et al.
10,164,577 B2 12/2018 Briffa et al.
10,193,441 B2 1/2019 Giuliano
10,291,184 B1 5/2019 Sutskover et al.
10,348,251 B2 7/2019 Ishiwata et al.
10,389,235 B2 8/2019 Giuliano
10,554,187 B2 2/2020 Nentwig
10,658,981 B2 5/2020 Briffa et al.
10,666,200 B2 5/2020 Gebeyehu et al.
10,749,476 B2 8/2020 Sutskover et al.
10,840,805 B2 11/2020 Perreault et al.
10,855,228 B2 12/2020 Eichler et al.
10,862,428 B2 12/2020 Henzler et al.
10,938,351 B2 3/2021 Khlat
10,958,218 B2 3/2021 Gebeyehu et al.
10,979,007 B2 * 4/2021 Cho .......................... H03F 3/19
10,985,702 B2 4/2021 Khlat et al.
10,992,265 B2 4/2021 Hoversten et al.
11,038,471 B2 6/2021 Drogi et al.
11,043,918 B2 6/2021 Tanaka et al.
11,121,684 B2 9/2021 Henzler et al.
11,191,028 B2 11/2021 Hoversten et al.
11,223,323 B2 1/2022 Drogi et al.
11,223,324 B2 1/2022 Balteanu et al.
11,223,325 B2 1/2022 Drogi et al.
11,245,367 B2 2/2022 Garrett et al.
11,336,242 B2 5/2022 Kim et al.
11,374,538 B2 6/2022 Drogi et al.
11,463,048 B2 10/2022 Henzler et al.
11,558,014 B2 1/2023 Tanaka et al.
11,595,005 B2 2/2023 Balteanu et al.
11,637,531 B1 4/2023 Perreault et al.
11,652,501 B2 5/2023 Kim et al.
11,664,727 B2 5/2023 Giuliano et al.
11,677,592 B2 6/2023 Belitzer
11,699,977 B2 7/2023 Henzler et al.
11,736,010 B2 8/2023 Giuliano et al.
11,757,410 B2 9/2023 Hoversten et al.
11,757,411 B2 9/2023 Tanaka et al.
11,909,358 B1 2/2024 Perreault et al.
12,057,811 B2 8/2024 Kim et al.
12,126,307 B2 10/2024 Balteanu et al.
12,537,482 B2 1/2026 Zou et al.
2006/0178119 A1 8/2006 Jarvinen
2006/0198466 A1 9/2006 Wright et al.
2008/0019459 A1 1/2008 Chen et al.
2010/0060354 A1 * 3/2010 Maeda .................... H03F 1/565 330/124 R
2010/0073084 A1 3/2010 Hur et al.
2012/0163489 A1 6/2012 Ramakrishnan
2012/0269240 A1 10/2012 Balteanu et al.
2013/0207731 A1 8/2013 Balteanu
2014/0057684 A1 2/2014 Khlat
2014/0086301 A1 3/2014 Akhavan et al.
2014/0087673 A1 * 3/2014 Mostov ................... H03F 1/565 455/78
2015/0068421 A1 3/2015 Kreß et al.
2015/0139362 A1 5/2015 Lee et al.
2016/0050629 A1 2/2016 Khesbak et al.
2016/0099686 A1 4/2016 Perreault et al.
2016/0112009 A1 * 4/2016 Hitomi ................... H04B 1/525 455/127.2
2018/0062622 A1 3/2018 Yan et al.
2018/0123458 A1 5/2018 Paek et al.
2018/0198416 A1 7/2018 Hur et al.
2018/0241350 A1 8/2018 Leipold et al.
2018/0316311 A1 11/2018 Gebeyehu et al.
2018/0331659 A1 11/2018 Khesbak et al.
2019/0103217 A1 4/2019 Pallesgaard
2019/0131941 A1 * 5/2019 Ishihara .................. H03F 3/245
2020/0313621 A1 * 10/2020 Hoversten ................. H03F 3/19
2021/0288614 A1 9/2021 Hoversten et al.
2021/0385752 A1 12/2021 Hoversten et al.
2022/0103066 A1 3/2022 Chen et al.
2022/0131463 A1 4/2022 Giuliano et al.
2022/0149725 A1 5/2022 Garrett et al.

(56) References Cited

U.S. PATENT DOCUMENTS

| | | | |
|---|---|---|---|
| 2023/0056740 | A1 | 2/2023 | Perreault et al. |
| 2023/0057037 | A1 | 2/2023 | Hoversten et al. |

FOREIGN PATENT DOCUMENTS

| | | | |
|---|---|---|---|
| CN | 104485917 | A | 12/2017 |
| JP | H0294628 | | 4/1990 |
| JP | H 10-294628 | A | 11/1998 |
| JP | 2015-507452 | A | 3/2015 |
| JP | 2015-138560 | | 7/2015 |
| WO | WO 2012/148918 | | 11/2012 |
| WO | WO 2013/126610 | | 8/2013 |
| WO | WO 2014/046806 | | 3/2014 |
| WO | WO 2015/123267 | | 8/2015 |
| WO | WO 2017/006688 | | 1/2017 |
| WO | WO 2017/196826 | | 11/2017 |
| WO | WO 2020/205398 | | 10/2020 |
| WO | WO 2020/206246 | | 10/2020 |
| WO | WO 2021/007299 | | 1/2021 |

OTHER PUBLICATIONS

Korean Notice of Allowance (with English translation of Allowed Claims) dated Jul. 30, 2024 for Korean Patent Application No. 10-2021-7034756; 9 pages.
U.S. Appl. No. 18/185,832, filed Mar. 17, 2023, Hoversten, et al.
Non-Final Office Action dated Sep. 2, 2020 for U.S. Appl. No. 16/369,667; 12 Pages.
Non-Final Office Action dated Feb. 24, 2023 for U.S. Appl. No. 17/216,919; 8 pages.
Notice of Allowance dated Mar. 3, 2021 for U.S. Appl. No. 16/369,667; 9 Pages.
Response to U.S. Office Action dated Sep. 2, 2022 for U.S. Appl. No. 16/369,667, filed Nov. 23, 2020; 12 pages.
Communication Pursuant to Article 94(3) EPC dated Dec. 6, 2024, for European Application No. 20784025.7; Response filed Jun. 5, 2025; 19 pages.
Chinese Office Action dated Dec. 27, 2024, for Chinese Application No. 202080039255.2; 27 pages w/English translation.
Chinese Office Action dated Dec. 27, 2024, for Chinese Application No. 202080039255.2; Response filed May 16, 2025; 16 pages w/English translation.
European Examination Report dated Dec. 6, 2024, for European Application No. 20 784 025.7-1201; 12 Pages.
Japanese Appeal Brief (with English Translation) dated Jun. 20, 2024, for Japanese Application No. 2021-560322; 14 Pages.
Japanese Notice of Allowance (with English Translation) dated Oct. 1, 2024, for Japanese Application No. 2021-560322; 5 pages.
PCT International Search Report and Written Opinion dated Sep. 1, 2023, for International Application No. PCT/US2023/063820; 11 pages.
Japanese Office Action (with English Translation) dated May 16, 2023, for Japanese Application No. 2021-560322; 16 pages.
Japanese Office Action dated May 16, 2023, for Japanese Application No. 2021-560322; Response (with English Translation) filed on Oct. 19, 2023; 17 pages.
Japanese Office Action (with English Translation) dated Jan. 12, 2024, for Japanese Application No. 2021-560322; 13 pages.
Japanese Office Action dated Jan. 12, 2024, for Japanese Application No. 2021-560322; Response (with English Translation) filed on May 13, 2024; 10 pages.
Korean Office Action (with English Translation) dated Aug. 21, 2023, for Korean Application No. 10-2021-7034756; 24 pages.
Korean Office Action dated Aug. 21, 2023, for Korean Application No. 10-2021-7034756; Response (with English Translation) filed on Oct. 17, 2023; 72 pages.
Korean Office Action (with English Translation) dated Feb. 26, 2024, for Korean Application No. 10-2021-7034756; 17 pages.
Korean Office Action dated Feb. 26, 2024, for Korean Application No. 10-2021-7034756; Response (with English Translation) filed Jun. 24, 2024; 140 pages.
PCT International Search Report and Written Opinion dated Feb. 9, 2024, for International Patent Application No. PCT/US2023/075689; 11 pages.
European Office Action dated Dec. 6, 2024 for Application No. 20784025.7-1201; 12 Pages.
Cao, et al.; "A Family of Zero Current Switching Switched-Capacitor DC-DC Converters"; 2010 Twenty-Fifth Annual IEEE Applied Power Electronics Conference and Exposition (APEC); Feb. 21-25, 2010; 8 Pages.
Cao, et al.; "Multiphase Multilevel Modulator DC-DC Converter for High-Current High-Gain TEG Application"; IEEE Transactions on Industry Application; vol. 47; No. 3; May/Jun. 2011; 9 Pages.
Chen, et al; "A High Efficiency High Power Step-Up Resonant Switched-Capacitor"; 2012 IEEE Energy Conversion Congress and Exposition (ECCE); Sep. 15-20, 2012; 5 Pages.
Shoyama, et al.; "Resonant Switched Capacitor Converter with High Efficiency"; 2004 35$^{th}$ Annual IEEE Power Electronics Specialists Conference; 2004; 7 Pages.
Sun, et al.; "High Power Density, High Efficiency System Two-Stage Power Architecture for Laptop Computers"; 2006 37th IEEE Power Electronics Specialists Conference; Jun. 18-22, 2006; 7 Pages.
Unknown; "Fundamentals of Power Electronics"; Chapter 19: Resonant Conversion; Sep. 19, 2019; 87 Pages.
Yeung, et al.; "Multiple and Fractional Voltage Conversion Ratios for Switched-capacitor Resonant Converters"; 2001 IEEE 32nd Annual Power Electronics Specialists Conference (IEEE Cat. No. 01CH37230); Jun. 17-21, 2001; 6 Pages.
Communication Pursuant to Rules 70(2) and 70a(2) EPC dated Jan. 3, 2023 for European Application No. 20784025.7; 1 page.
Extended European Search Report dated Dec. 9, 2022 for European Application No. 20784025.7; 38 pages.
U.S. Notice of Allowance dated Nov. 17, 2022 for U.S. Appl. No. 17/216,919; 8 pages.
Response to U.S. Office Action dated May 10, 2022 for U.S. Appl. No. 17/216,919; Response filed on Sep. 12, 2022; 10 pages.
U.S. Non-Final Office Action dated May 10, 2022 for U.S. Appl. No. 17/216,919; 10 pages.
International Preliminary Report on Patentability dated Oct. 14, 2021 for International Patent Application No. PCT/US2020/021976; 8 pages.
International Search Report dated Jun. 12, 2020 for International Application No. PCT/US2020/021976; 4 pages.
Written Opinion of the ISA dated Jun. 12, 2020 for International Application No. PCT/US2020/021976; 6 pages.
Godoy et al., "A 2.4-GHz, 27-dBm Asymmetric Multilevel Outphasing Power Amplifier in 65-nm CMOS;" IEEE Journal of Solid-State Circuits, vol. 47, No. 10, pp. 2372-2384, published Oct. 2012; 35 pages.
Walling et al., "A Class-G Supply Modulator and Class-E PA in 130nm CMOS;" IEEE Journal of Solid-State Circuits, vol. 44, No. 9, pp. 2339-2347, published Sep. 2009; 9 pages.
Vasic et al., "Multilevel Power Supply for High Efficiency RF Amplifiers;" 2009 IEEE Applied Power Electronics Conference, pp. 1233-1238, published Feb. 2009; 6 pages.
Choi et al., "A ΔΣ-Digitized Polar RF Transmitter;" IEEE Transactions on Microwave Theory and Techniques, vol. 55, No. 12, pp. 2679-2690, published Dec. 2007; 12 pages.
F.H. Raab, "Average Efficiency of Class-G Power Amplifiers," IEEE Transactions on Consumer Electronics, vol. CE-32, No. 2, pp. 145-150, published May 1986; 6 pages.
Notice of Allowance dated Jan. 6, 2026, for U.S. Appl. No. 18/185,832; 9 pages.
Response to Office Action dated Aug. 27, 2025 for U.S. Appl. No. 18/185,832, filed Nov. 25, 2025; 12 Pages.
International Preliminary Report on Patentability dated Apr. 17, 2025 for International Application No. PCT/US2023/075689; 10 Pages.
Office Action dated Aug. 27, 2025 for U.S. Appl. No. 18/185,832; 11 Pages.

(56) References Cited

OTHER PUBLICATIONS

Communication Pursuant to Article 94(3) EPC dated Feb. 9, 2026, for European Application No. 20784025.7; 8 pages.
Notice of Preliminary Rejection (w/English translation) dated Nov. 30, 2025, for Korean Patent Application No. 10-2024-7036037; 8 pages.

* cited by examiner

SUPPLY MODULATION TRANSMITTER WITH SWITCH NETWORK

CROSS REFERENCE TO RELATED APPLICATIONS

This application is a continuation-in-part of co-pending U.S. application Ser. No. 17/216,919 (filed Mar. 30, 2021), which is a continuation of U.S. patent application Ser. No. 16/369,667 (filed Mar. 29, 2019) now issued as U.S. Pat. No. 10,992,265. The contents of all applications and patents listed in this section are incorporated herein by reference in their entirety.

FIELD

The subject matter disclosed herein relates generally to radio frequency (RF) circuits and more particularly to devices, systems, and techniques for use in operating supply modulation transmitters.

BACKGROUND

As is known in the art, a radio frequency (RF) transmitter is a device that produces RF signals. RF transmitters may be included, for example, as part of a radio communication system that uses electromagnetic waves (radio waves) to transmit information over a distance.

As is also known, in RF communications transmitters (such as those suitable for use in a mobile device such as a cell phone, for example), a trade-off must generally be made between energy efficiency and linearity. It would, therefore, be desirable to provide systems and techniques that allow a user to transmit data carrying RF signals with both high efficiency and high linearity.

SUMMARY

One general aspect includes a circuit comprising a multi-output power supply that generates multiple output signals (e.g. multiple voltage signals which may be at one or a plurality of voltage levels); at least one power modulator circuit generate a modulated output signal from the multiple output signals of the multi-output power supply; at least one pulse shaping network (PSN) having at least one passive element, the PSN configured to shape (i.e., filter or modify the trajectory of) the modulated output signal of a multi-output power supply; at least one RF amplifier (e.g., an RF power amplifier coupled to receive a modulated signal from a multiple output supply generator; and a configuration switch network having a plurality of switches to create or modify signal paths from the at least one modulator circuit to the at least one RF amplifier.

Implementations may include one or more of the following features. The multi-output power supply may include a boost converter. The switching network may include a network of switches having an input terminal and an output terminal. In embodiments, the network of switches (e.g. a configuration switch network) may comprise any switch configuration. In embodiments in which capacitive coupling (e.g., due to parasitic capacitance of a switch) is a concern, a configuration switch network may comprise switches coupled in a T-configuration (also referred to herein as a T-arrangement, or a T-network). In embodiments in which capacitive coupling is not a concern, the T-network may be replaced by another switch configuration (i.e., a non T-network switch configuration). In embodiments, in which a T-network of switches is used, the T-network of switches may include: a first switch having a first terminal that forms the input terminal of the T-network of switches and a second terminal coupled to a node, a second switch having a first terminal that forms the output terminal of the T-network of switches and a second terminal coupled to the node, and a third switch having a first terminal coupled to the node and a second terminal coupled to a reference plane. The reference plane is a ground plane. The T-network of switches is coupled in a cascaded configuration with the power modulator circuit to connect or disconnect the modulated power output signal to the at least one power amplifier. The T-network of switches is coupled across the PSN and configured to selectively short the PSN. The T-network of switches is coupled across the passive element of the PSN and configured to alter a transfer function of the PSN by selectively shorting the passive element. At least a first set of the plurality of switches are located on a first integrated circuit die and at least a second set of the plurality of switches are located on a second integrated circuit die. The PSN may include a filter. Implementations of the described techniques may include hardware, a method or process, or computer software on a computer-accessible medium.

One general aspect includes a switching network having a plurality of switches. The switching network also includes at least one input terminal coupled to receive a modulated power signal; at least one output terminal coupled to provide modulated power to at least one power amplifier, and at least one T-network of switches coupled to create of modify a power signal path from the input terminal to the output terminal.

Implementations may include one or more of the following features. The switching network is coupled to a pulse shaping network (PSN) configured to shape the modulated power signal, the pulse shaping network having at least one electronic element (e.g. a passive component). The T-network of switches is coupled across the PSN and configured to selectively short the PSN. The T-network of switches is coupled across the electronic element of the PSN and configured to alter a transfer function of the PSN by selectively shorting the electronic element. The T-network of switches may include: a first switch having a first terminal that forms an input terminal of the T-network of switches and a second terminal coupled to a node, a second switch having a first terminal that forms an output terminal of the T-network of switches and a second terminal coupled to the node, and a third switch having a first terminal coupled to the node and a second terminal coupled to a reference plane. The reference plane is a ground plane. The T-network of switches is coupled in a cascaded configuration with the modulated power signal to connect or disconnect the modulated power signal to the output terminal. Implementations of the described techniques may include hardware, a method or process, or computer software on a computer-accessible medium.

BRIEF DESCRIPTION OF THE DRAWINGS

The foregoing features may be more fully understood from the following description of the drawings in which.

DETAILED DESCRIPTION

Figure 1:
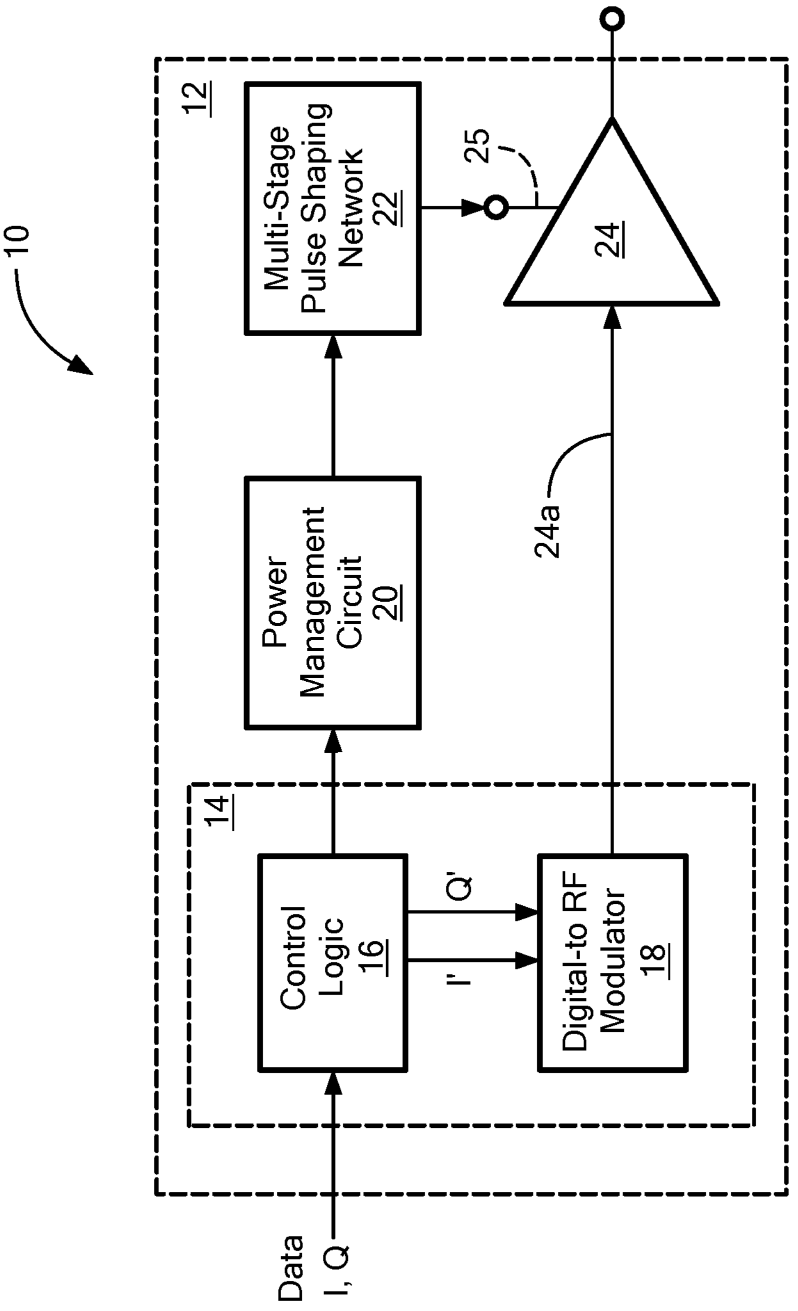
FIG. 1 is a block diagram of an illustrative embodiment of a radio frequency (RF) transmitter which includes a power management circuit (PMC) having a single output and a multi-stage (or split) pulse shaping network (PSN)

Referring now to FIG. 1, an illustrative radio frequency (RF) transmit system 10 capable of concurrently achieving both high efficiency and high linearity includes a discrete supply modulation system 12 which supplies a bias voltage signal to a bias (or supply) terminal 23 of a radio frequency amplifier 24.

Discrete supply modulation system 12 includes a controller 14 comprising control logic circuitry 16 (or more simply control logic 16). Control logic 16 may receive or otherwise acquire transmit data to be transmitted into a wireless channel. The transmit data may be in any format (e.g., a binary bit stream; I and Q data; etc.). Control logic 16 may then use this data, as well as other possible factors, to provide signals to a digital-to-RF modulator 18 which receives the signals provided thereto and generates a corresponding RF signal to be transmitted.

In some embodiments, the goal may be to generate an RF transmit signal that includes an accurate representation of the transmit data. Any of a number of different modulation and coding schemes (MCSs) may be used to represent the transmit data within the RF transmit signal. The MCS may include, for example, binary phase shift keying (BPSK), quadrature phase shift keying (QPSK), quadrature amplitude modulation (e.g., QAM, 16 QAM, 64 QAM, 128 QAM, etc.), orthogonal frequency division multiplexing (OFDM), and/or others. Some of these MCSs have relatively high peak to average power ratios.

MCSs having high peak to average power ratios typically require highly linear power amplification (e.g. via an RF power amplifier such as power amplifier 24 in FIG. 1) to provide an accurate representation of transmit data. In various embodiments described herein, transmission systems and techniques are described that are capable of providing efficient power amplification with sufficient linearity to support MCSs having high peak to average power ratios and/or having stringent error vector magnitude (EVM) requirements.

As shown in FIG. 1, control logic 16 acquires transmit data (e.g. I, Q data which may be a stream of data (i.e., transmit data) to be transmitted from RF transmitter 10) and uses the data to provide input information to the digital-to-RF modulator 18 and to a power management circuit 20. In one possible approach, control logic 16 may provide separate I and Q data to the digital to RF modulator. The digital-to-RF modulator may then use the I, Q information to modulate an RF carrier wave to generate a corresponding RF signal at an output thereof. As is well known, I and Q data is generally representative of an amplitude and a phase. Thus, I and Q may, for example, have a corresponding amplitude A and phase θ.

The RF signal output by the digital-to-RF modulator in response to data provided thereto (e.g. I and Q data) may, therefore, be an RF signal having amplitude A and phase θ. In some implementations, the input information provided to the digital-to-RF modulator may be in a format other than I and Q. For example, in one possible approach, amplitude and phase (A, θ) information may be delivered to the digital-to-RF modulator by controller 14. As described above, the input information applied to the digital-to-RF modulator may change on a sample-by-sample basis in some embodiments.

Regardless of the format in which digital-to-RF modulator 18 receives data provided thereto, the digital-to-RF modulator 18 provides an RF signal to an input 24*a* of an RF amplifier 24. One of ordinary skill in the art will understand how to select the characteristics of RF amplifier 24 to suit the needs of a particular application. In some applications (e.g. mobile handset applications) RF amplifier 24 comprises an RF power amplifier. RF amplifier 24 receives the RF signal provided thereto and provides an amplified version of the RF signal at an output thereof. The output of RF amplifier 24 may be coupled to another RF circuit or to the input of an antenna, for example.

As noted above, power management circuit (PMC) receives the information (e.g. control signals) provided thereto from the control logic 16 and in response thereto provides variable supply bias voltages (i.e. bias voltage signals) to an RF amplifier 24 (e.g. an RF power amplifier). In embodiments, the variable supply bias voltages are provided in the form of pulses with each pulse having one of a discrete number of voltage levels. That is, the PMC provides one of a plurality of discrete bias voltages to the bias terminal of the RF amplifier. Such discrete voltage supply levels provided by the PMC may be predetermined or may be adapted over time based upon required average transmit power levels or other factors.

Transitions between pulses of different voltage levels (i.e., transitions from one voltage level to another) can give rise to undesired frequency components in the varying supply bias voltage signals V(t) (i.e. the bias voltage signals). Such variable supply bias voltages are provided to the bias (or supply) terminal 23 of the amplifier 24 through a multi-stage pulse shaping network (PSN) 22. The multi-stage PSN functions to filter out or otherwise remove undesirable frequency components in the bias voltage signal (i.e., the PSN filters or shapes the trajectory of the bias voltage signal). Thus, a filtered bias voltage signal is provided to the supply terminal 25 of the RF amplifier 24.

As also noted above, PMC provide a variable supply bias voltage V(t) to the RF amplifier based upon a control signal from the control logic 16. The PMC may be configured to selectively supply one of a plurality of discrete voltages to the RF amplifier and may supply the discrete voltage to the RF amplifier via the PSN.

For reasons which will become apparent from the description provided hereinbelow, the multi-stage PSN comprises spaced-apart stages (i.e. stages which are physically spaced apart) which may, for example, comprise lossless filter elements, including inductors and capacitors, and may further include lossy elements, such as resistors and magnetic beads. The multi-stage PSN serves to provide shaping and/or bandwidth limitation of the voltage transitions between discrete voltage levels and may provide damping of oscillations that might otherwise occur. In embodiments, the multi-stage PSN may be selected to provide a desirable filter response characteristic.

Significantly, and as will also become apparent from the description provided hereinbelow, the multi-stage PSN is physically divided into multiple stages. This approach allows the multi-stage PSN to provide appropriately filtered bias signals to multiple amplifiers without reproducing components of all PSN sections with each additional amplifier. The multi-stage PSN 22 is provided having desirable stop band and rejection band frequency characteristics as well as desirable pass band frequency and rise time characteristics.

Such a multi-stage PSN arrangement is suitable for use with transmit systems in mobile handsets operating in accordance with a $5^{th}$ generation (5G) communications and other connectivity protocols such as 802.11 a/b/g/n/ac/ax/ad/ay. Such a multi-stage PSN arrangement is also suitable for use with 5G multiple-input, multiple-output (MIMO), uplink carrier aggregation (ULCA), and beamforming systems.

Figure 2:
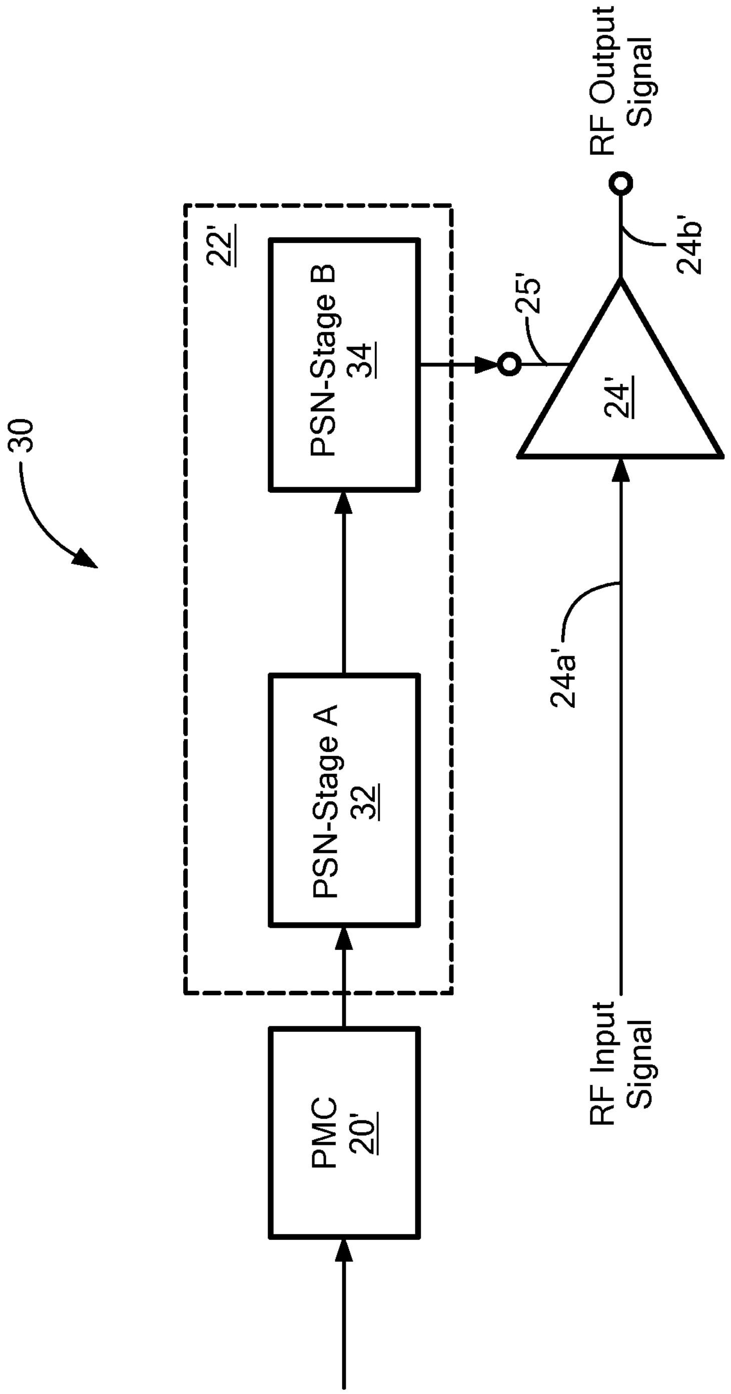
FIG. 2 is a block diagram of another illustrative embodiment of an RF transmitter which includes a single output PMC having a multi-stage (or split) PSN coupled thereto.

Referring now to FIG. 2, an RF transmit circuit 30 includes a PMC 20' (which may be the same as or similar to PMC 20 described above in conjunction with FIG. 1) having an input configured to receive information (e.g. control signals) provided thereto (e.g. from a controller such as controller 14 described above in conjunction with FIG. 1) and in response thereto provides variable supply bias voltages (e.g. bias signals having one of a plurality of discrete different voltage levels at a particular point in time) to an RF amplifier 24' having an RF input **24*a*', an RF output 24*b*' and a supply terminal 25'**.

A variable supply bias voltage is provided to amplifier 24' through a multi-stage PSN 22', which may be the same as or similar to PSN 22 described above in conjunction with FIG. 1. In this illustrative embodiment, the multi-stage PSN 22' includes a first PSN stage 32 (and designated in FIG. 2 as "PSN—Stage A") and a second PSN stage 34 (and designated in FIG. 2 as "PSN—Stage B") which is physically separated from PSN stage A.

By physically dividing the PSN 22', into multiple stages, it is not necessary to reproduce components of the first PSN stage (i.e. Stage A in FIG. 2) in the second PSN stage (i.e. Stage B in FIG. 2). This approach results in the flexibility to place relatively large PSN components on a substrate (e.g. a printed circuit board (PCB)) in areas of the substrate better able to accommodate the larger circuit structures. That is, the multi-stage PSN approach allows PSN components which require an amount of area or volume (generally referred to as space or real estate) which is greater than the area or volume required by a majority of the other components which make up the PMC to be physically located in an area of a PCB which can accommodate such components. Furthermore, the multi-stage PSN approach allows the use of parasitic elements (e.g. parasitic inductance) which allows a reduction of size (and ideally elimination of) circuit components. This results in space savings and also in cost reduction for a PSN provided in accordance with the multi-stage PSN techniques described herein.

With this multi-stage PSN approach it is possible to control receive baseband (RxBN) and out of band emissions for discrete supply modulation transmitters while maintaining linearity and efficiency while also accommodating an amplifier (e.g. an RF PA) which is physically distant from the PMC on an IC or on a PCB or on any type of substrate in a cost-effective manner and which is suitable for a mobile device form factor.

In some embodiments, one or more RF amplifiers may be used to generate a transmit signal in an RF transmitter. For example, FIG. 3 is a block diagram illustrating an RF transmitter that includes a plurality of power amplifiers in accordance with an embodiment.

Figure 3:
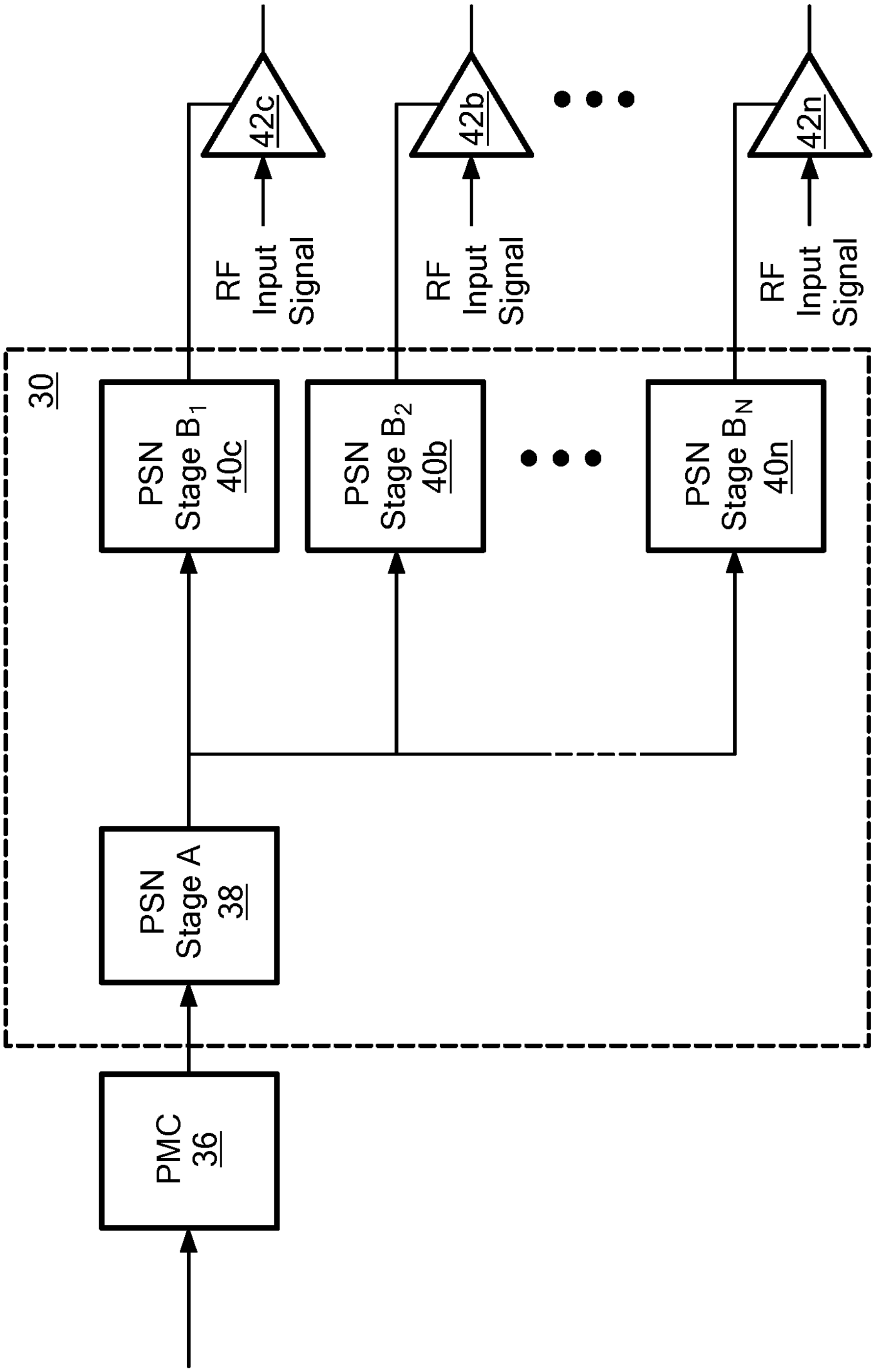
FIG. 3 is a block diagram of an illustrative RF transmitter having a single output PMC and an alternate embodiment of a multi-stage PSN coupled to a plurality of RF amplifiers.

Referring now to FIG. 3, a PMC 36 has an input configured to receive information (e.g. control signals) provided thereto (e.g. from a controller such as controller 14 described above in conjunction with FIG. 1) and in response thereto provides variable supply bias voltages to a plurality of RF amplifiers **42*a*-42*n*, based upon control signals from the controller. In embodiments, one or all of RF amplifiers 42** may correspond to RF PAs.

The variable supply bias voltages are provided to amplifiers **42*a*-42N through a multi-stage PSN 30. In this illustrative embodiment, the multi-stage PSN 30 includes a first PSN stage 38 (and designated in FIG. 3 as "PSN Stage A") and a plurality of second PSN stage 40*a*-40N (and designated in FIG. 3 as "PSN Stage $B_i$"). In this illustrative embodiment, the number of second PSN stages 40 matches the number of amplifiers 42 (i.e. there is a 1:1 correspondence between the number of PSN second stages and the number of amplifiers receiving voltage supply signals through the PSN 30**).

With this approach, it is possible to control RxBN and out of band emissions for discrete supply modulation transmitters while maintaining linearity and efficiency while also accommodating a plurality of RF amplifiers 42 which are physically distant from the PMC in a cost-effective manner suitable for a mobile device form factor.

Furthermore, the characteristics of each second PSN stage 40 may be matched to the characteristics of the RF amplifier to which the PSN is coupled. It should, of course, be appreciated that in other embodiments, a single second PSN stage may be coupled to multiple RF amplifiers 40.

By physically dividing the multi-stage PSN it is not necessary to reproduce components of the first PSN stage (i.e. Stage A) for each amplifier. Thus, multi-stage PSN serves multiple amplifiers 42*a*-42N while only having multiple second stages. Since it is not necessary to repeat the entire PSN for each amplifier, this approach saves real estate on a PCB (or similarly, the size of a PCB required to accommodate a PMC, PSN and amplifier (and related circuits) may be reduced).

Thus, with this multi-stage PSN approach, it is possible to control receive baseband (RxBN) and out of band emissions for discrete supply modulation transmitters while maintaining linearity and efficiency while also accommodating a plurality of RF amplifiers (e.g. RF Pas) which are physically distant from the PMC in a cost-effective manner suitable for a mobile device form factor.

Figure 4:
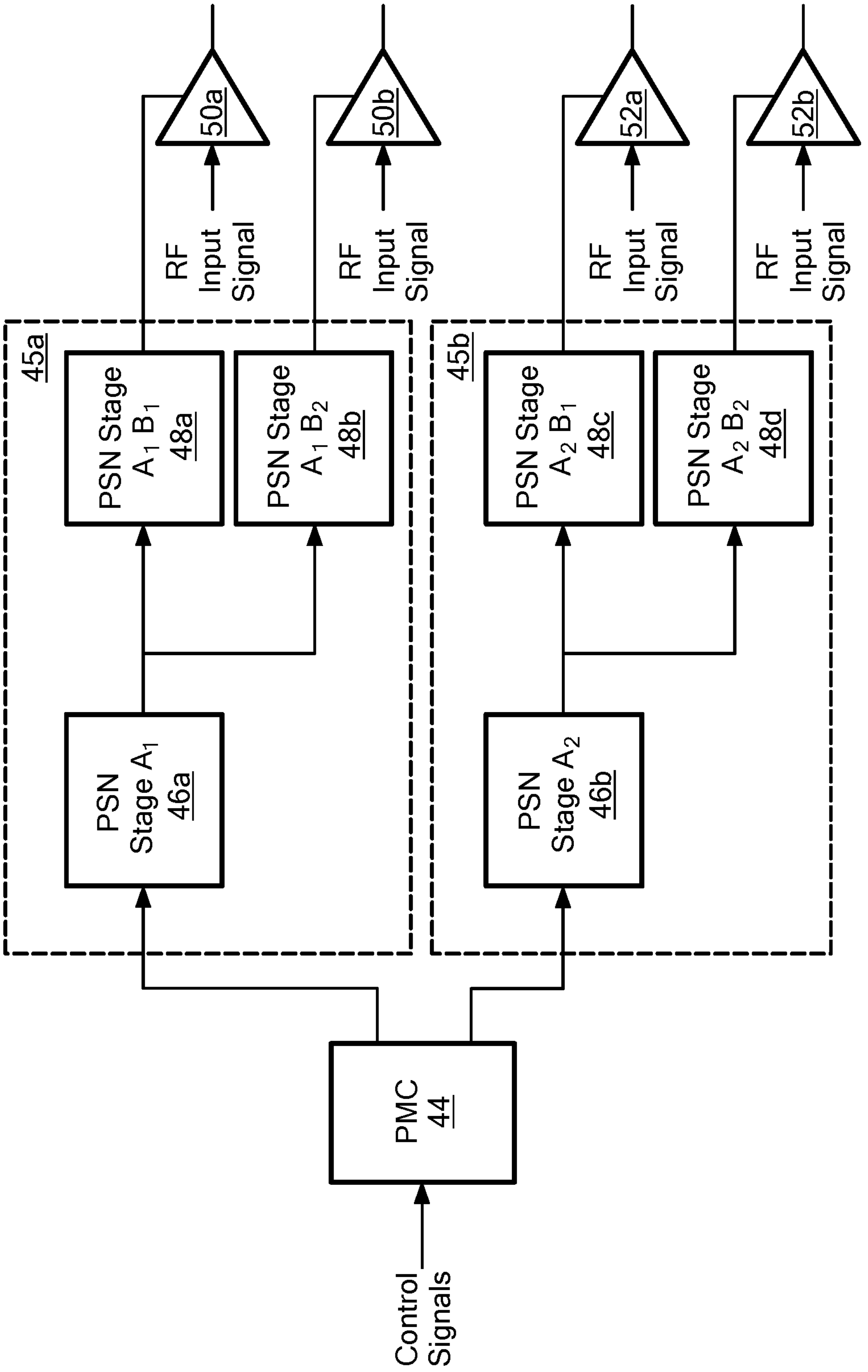
FIG. 4 is a block diagram of an illustrative RF transmitter having a multi-output PMC and an alternate embodiment of a multi-stage PSN coupled to a plurality of RF amplifiers.

Referring now to FIG. 4, a portion of a transmit circuit includes a PMC 44 having an input configured to receive control signals (e.g. from a control logic circuit such as control logic circuit 16 described above in conjunction with FIG. 1). PMC 44 has a plurality of outputs (i.e. PMC 44 is a multi-output PMC). In this illustrative embodiment, to promote clarity in the text and drawings, PMC 44 is illustrated as a dual output PMC. Those of ordinary skill in the art will appreciate, of course, recognize that PMC 44 may have any number of outputs and that the particular number of outputs with which to provide PMC 44 is selected in accordance with a variety of factors including, but not limited to the number of amplifiers which receive signals from PMC 44 and the needs of a particular application.

In this illustrative embodiment, each output 44*a*, 44*b* of PMC 44 is coupled to a respective first PSN stage 46*a*, 46*b*. An output of each first PSN stage 46*a*, 46*b* is coupled to corresponding ones of second PSN stages 48*a*, 48*b*, 48*c*, 48*d*. The outputs of second PSN stages 48*a*-48*d* are coupled to bias terminals of RF amplifiers 50*a*, 50*b*, 52*a*, 52*b* respectively.

Thus, FIG. 4 illustrates a transmit circuit comprising a plurality of, here four, RF amplifiers 50*a*, 50*b*, 52*a*, 52*b* and includes a PMC 44 which provides variable supply bias voltages (e.g. selected ones of a plurality of supply bias voltages in the case of supply modulation) to bias terminals of the amplifiers 50*a*, 50*b*, 52*a*, 52*b* via a bias supply signal path having respective ones of a pair of multi-stage PSNs 45*a*, 45*b* coupled thereto. In this illustrative embodiment, a first PSN 45*a* comprises a first PSN stage 46*a* (and designated in FIG. 4 as "PSN Stage A1") and a plurality of second PSN stages 48*a*, 48*b* (and designated in FIG. 4 as "PSN Stage A1B1" and "PSN Stage A1B2"). A second PSN 45*b* comprises a first PSN stage 46*b* (and designated in FIG. 4 as "PSN Stage A2") and a plurality of second PSN stages 48*c*, 48*d* (and designated in FIG. 4 as "PSN Stage A2B1" and "PSN Stage A2B2").

It should be appreciated that the electrical characteristics of second PSN stages 48*a*, 48*b* are selected or configured to operate with the electrical characteristics of first PSN stage 46*a* and the respective RF amplifier to which the second stage is coupled while the electrical characteristics of second PSN stages 48*c*, 48*d* are selected or configured to operate with the electrical characteristics of first PSN stage 46*b* and the respective RF amplifier to which the second stage is coupled. Thus, while the characteristics of the first PSN stages A1, A2 may differ and the characteristics of the second first PSN stages A1B1, A1B2, A2B1, A2B2 may differ, the first and second stages cooperate to provide appropriate and desired filtering to the variable supply bias voltages provided to the amplifiers 50*a*, 50*b*, 52*a*, 52*b*.

In general, it is desirable to provide a PSN having at least one, or ideally all, of the following qualities/characteristics: a desired amount of signal attenuation in the receive band (i.e. obtaining a desirable amount of attenuation from input to output at a desired offset frequency); a desired unloaded voltage step response (i.e. in response to a voltage step at the input, obtaining a desired peak output voltage assuming the PSN is unloaded (i.e. PA is not biased)); a desired loaded voltage step response: (i.e. in response to a voltage step at the input obtaining a desired peak output voltage assuming the PSN is loaded (i.e. PA is biased); a desired AC output impedance (i.e. for a fixed input voltage, obtaining a desired output voltage variation in response to a varying AC load current at desired frequencies); a desired DC output impedance: (i.e. for a fixed input voltage, obtaining a desired output voltage variation in response to a DC load current); and a desired maximum inrush current (i.e. obtaining a desired peak current a PMIC must source to the PSN during a voltage step). A PSN having other qualities/characteristics may also be desirable.

It should be appreciated that, although in this illustrative embodiment, only two first stages and four second stages are shown, in other embodiments PMC may be coupled to more than two first stages and each first stage may be coupled to more than two second stage. In general, PMC may be provided having N outputs (where N is an integer greater than or equal to 1) and thus PMC may be coupled to at least as many as N first PSN stages and each of the N first PSN stages may be coupled to as many as M second stages (where M is an integer greater than or equal to 1). Furthermore, each of the second PSN stages may be coupled to P amplifiers (where P is an integer greater than or equal to 1).

Although in the illustrative embodiment described in FIG. 4, the number of second PSN stages 48 matches the number of amplifiers 50 (i.e. there is a 1:1 correspondence between the number of PSN second stages and the number of amplifiers receiving voltage supply signals through the PSN 30) in some embodiments, one or more of the second PSN stages may be coupled to more than one RF amplifiers.

Figure 5:
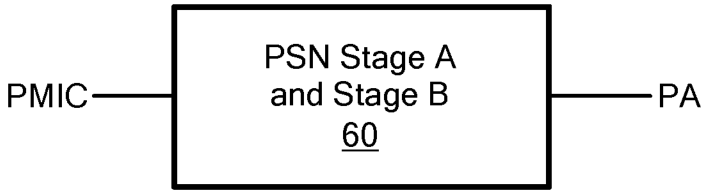
FIG. 5 is a block diagram of an illustrative embodiment of a multi-stage PSN.

Referring now to FIG. 5, a merged multistage PSN 60 includes merged stages Stage A and Stage B. Stages are comprised of series and shunt impedances formed using resistors, inductors, capacitors, and/or magnetic and/or ferrite beads. Depending upon system constraints several different types of stages can be used individually or cascaded together to meet requirements.

Figure 6:
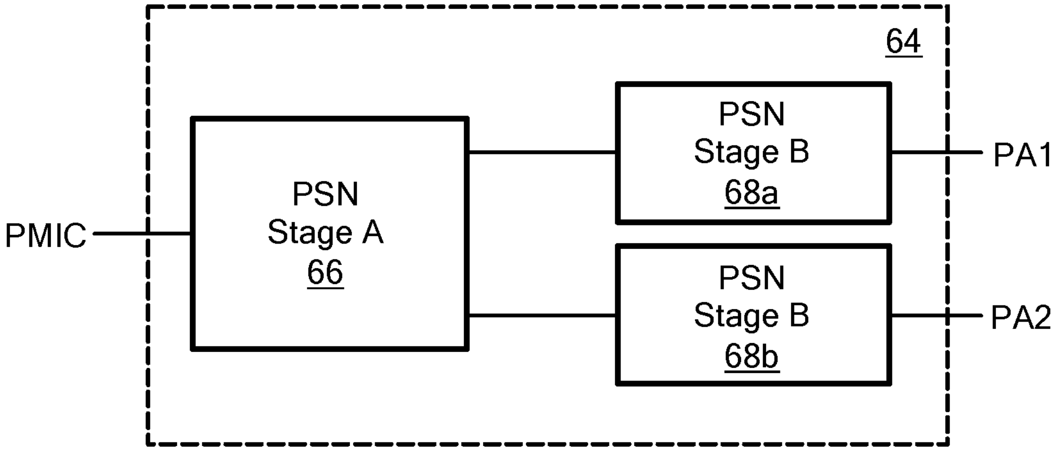
FIG. 6 is a block diagram of an alternate embodiment of a multi-stage PSN.

Referring now to FIG. 6, a multi-stage PSN 64 includes a first PSN stage 66 (and designated in FIG. 6 as "PSN Stage A") and a plurality of like second PSN stages 68*a*, 68*b* (with both stages designated in FIG. 6 as "PSN Stage B""). In this illustrative embodiment, second PSN stages 68*a*, 68*b* have the same or similar electrical characteristics and are configured to be coupled to RF amplifiers having like electrical characteristics. Of course, in embodiments in which RF amplifiers are not well-matched (e.g. the electrical characteristics of RF amplifiers 50*a*, 50*b* differ from each other), then the electrical characteristics of the second PSN stages (e.g. PSN stages 68*a*, 68*b*) will also differ from each other in a way which results in desired performance of the respective RF amplifiers coupled thereto (e.g. RF amplifiers 50*a*, 50*b* in FIG. 4).

Accordingly, in embodiments, the selection of electrical characteristics (and thus components) with which to provide a PSN stage depends upon the electrical characteristics of the PA to which the second PSN stage is coupled or about the requirements of the frequency band over which the PA operates.

It should be appreciated that the PMC and first PSN stage (e.g. PSN Stage A) can be located a significant distance from the second PSN stage (e.g. PSN Stage B and from an RF amplifier (e.g. a PA) receiving the variable supply bias voltages.

Figure 7:
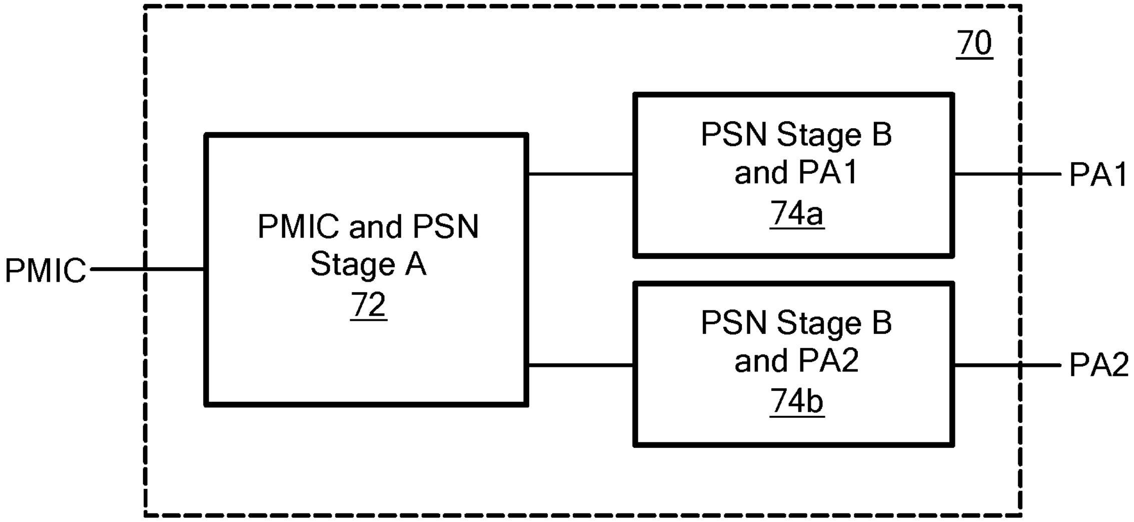
FIG. 7 is a block diagram of an alternate embodiment of a multi-stage PSN.

Referring now to FIG. 7, a portion of a transmit circuit 70 includes a first circuit corresponding to a power management circuit 72 provided as an integrated circuit (PMIC) having at least a portion of a first stage of a multi-stage PSN provided as part thereof (i.e. at least a portion of a first PSN stage is merged into the PMC circuit—e.g. by making use of parasitic elements associated with either the PMC and/or a signal path coupling the second PSN stage to the PMC). Thus, at least a portion of the first stage of the multi-stage PSN (and ideally the entire first stage of the multi-stage PSN) is merged (or integrated) with at least a portion of the PMC.

The circuit portion 70 further includes a pair of second circuits 74*a*, 74*b* corresponding to RF amplifiers (which may, for example, be RF power amplifiers) having at least portions of second stages of a multi-stage PSN integrated therewith (i.e. at least a portion of a second PSN stage is merged into each RF amplifier). As illustrated in FIG. 7, each of the second stages of the multi-stage PSN are integrated with at least portions of respective ones of one or more RF amplifiers (e.g. by making use of parasitic elements associated with either the RF amplifier and/or a signal path coupling the PSN second stage to the RF amplifier.

It should be noted that although only two RF amplifiers are shown in the illustrative embodiment of FIG. 7, any number of RF amplifiers may be used). It should also be noted that an integrated PMC and PSN Stage A can be located a significant distance from an integrated PSN Stage B and the RF amplifier. Thus, as illustrated and described, inductive and capacitances parasitic characteristics (sometimes referred to as parasitic elements) resultant from interconnect structures between Stages A and B (as well as structures within a PMC and an RF amplifier) can be designed into the overall impedance characteristics and/or response characteristics of a PSN.

In the illustrative embodiment shown in FIG. 7, the first and second stages of the PSN are absorbed (e.g. via the use of parasitic inductances and capacitances) into the respective PMC and RF amplifier circuitry (and hence, the filtering characteristics/functions performed by the PSN are likewise absorbed into the corresponding PMC and RF amplifier circuitry. Accordingly, the multi-stage PSN approach described herein leads to a module solution for both PMCs and PAs which can incorporate PSN stages to thereby further reduce the materials required to fabricate an RF transmit circuit as an IC.

Figure 8:
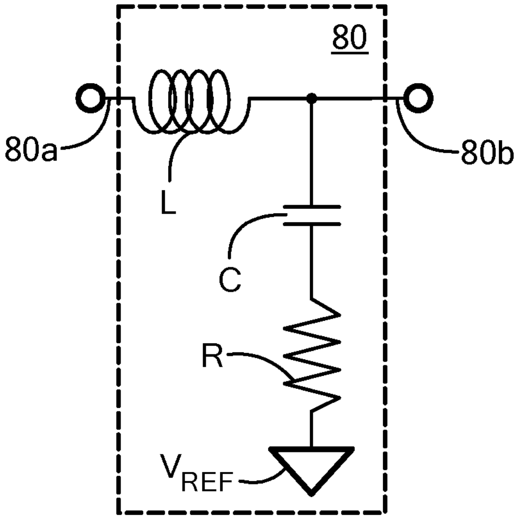
FIG. 8 is a schematic diagram of an illustrative filter circuit suitable for use with a multi-stage PSN having a leg with a shunt capacitor coupled in series with a resistive element between a filter terminal and a reference potential.
Figure 8A:
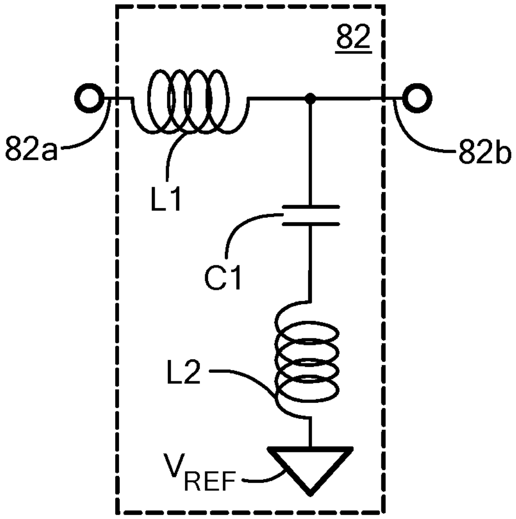
FIG. 8A is a schematic diagram of an illustrative filter circuit suitable for use with a multi-stage PSN having a leg with a shunt capacitor coupled in series with an inductive element between a filter terminal and a reference potential.
Figure 8B:
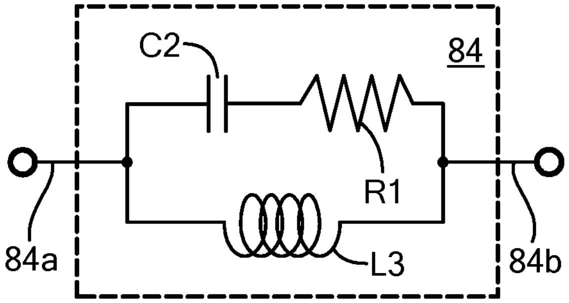
FIG. 8B is a schematic diagram of an illustrative filter circuit suitable for use with a multi-stage PSN having parallel inductive and capacitive paths coupled between the filter terminals.
Figure 8C:
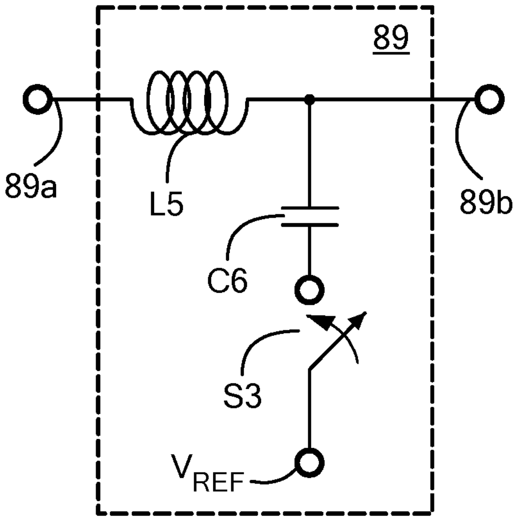
FIG. 8C is a schematic diagram of an illustrative filter circuit suitable for use with a multi-stage PSN having a shunt capacitor coupled in series with a switch between a filter terminal and a reference potential.
Figure 8D:
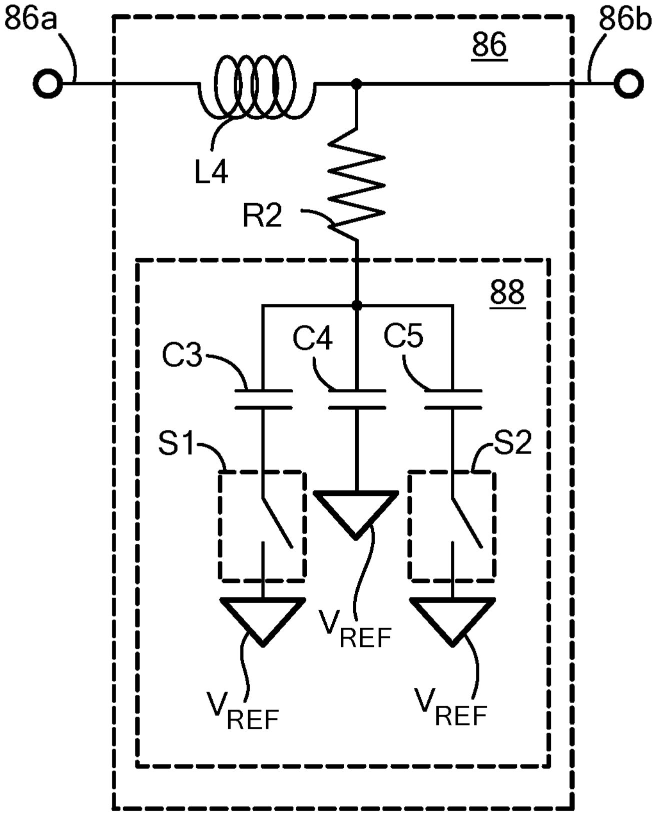
FIG. 8D is a schematic diagram of an illustrative filter circuit suitable for use with a multi-stage PSN having a shunt capacitor coupled in series with a switch between a filter terminal and a reference potential.
Figure 8E:
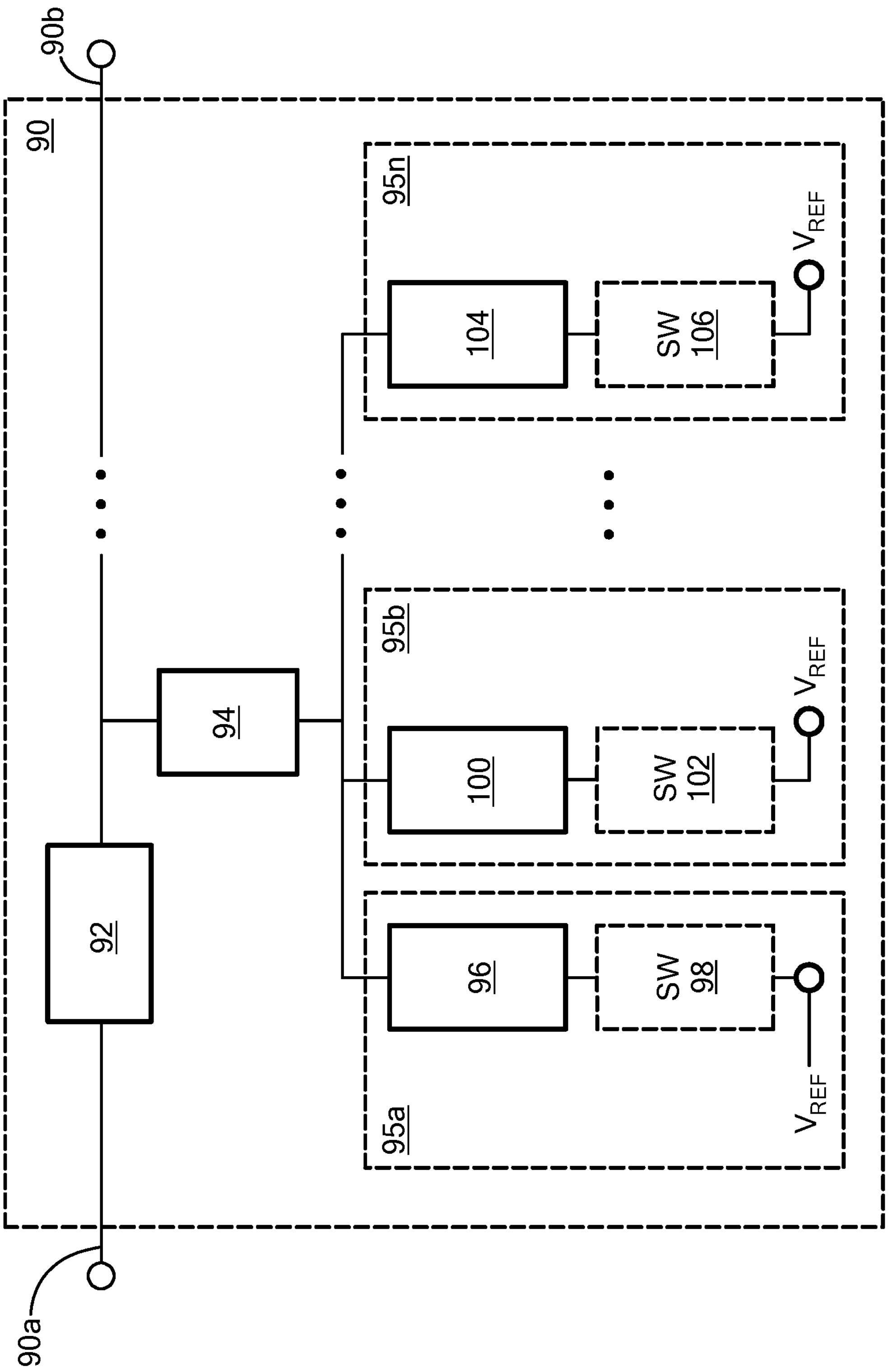
FIG. 8E is a block diagram of an illustrative PSN having.

Referring now to FIGS. 8-8E, a series of filter circuits suitable for use in the stages of a multi-stage PSN are shown. As will be described below in conjunction with FIGS. 8C, 8D and 8E, PSN stages can be made reconfigurable with switches to adjust electrical characteristics of a filter for different use cases.

Referring now to FIG. 8, a passive filter circuit 80 having first and second terminals 80*a*, 80*b* includes a series coupled inductor L (i.e. inductor L is serially coupled between terminals 80*a*, 80*b* of filter circuit 80). A first terminal of a capacitor C is coupled to a first one of first and second terminals of inductor L and a second terminal of capacitor C is coupled to a first terminal of a resistor R. A second terminal of resistor R is coupled to a reference potential (here illustrated as ground). After reading the disclosure provided herein, those of ordinary skill in the art will also appreciate that the reference potential $V_{REF}$ may correspond to ground or top some positive or negative potential (e.g. any positive or negative voltage). The particular reference potential $V_{REF}$ to use is selected to suit the needs of a particular application.

Referring now to FIG. 8A, a passive filter circuit 82 having first and second terminals 82*a*, 82*b* includes a series coupled inductor L1 (i.e. inductor L1 is serially coupled between terminals 82*a*, 82*b* of filter circuit 82). A first terminal of a capacitor C1 is coupled to a first one of first and second terminals of inductor L1 and a second terminal of capacitor C1 is coupled to a first terminal of a second inductor L2. A second terminal of inductor L2 is coupled to a reference potential $V_{REF}$.

Referring now to FIG. 8B, a passive filter circuit 84 includes a pair of signal paths coupled in parallel between first and second filter terminals 84*a*, 84*b*. A first one of the parallel signal paths includes an inductor L3 having a first terminal coupled to first filter terminal 84*a* and a second terminal coupled to second filter terminal 84*b*. A second one of the parallel signal paths includes a capacitor C2 having a first terminal coupled to the first filter terminal 84*a* and a second terminal coupled to a first terminal of a resistor R1. A second terminal of resistor R1 is coupled to the second filter terminal 84*b*.

Referring now to FIG. 8C, a reconfigurable filter circuit 89 having first and second terminals 89*a*, 89*b* includes a series coupled inductor L5 (i.e. inductor L5 is serially coupled between terminals 89*a*, 89*b* of filter circuit 89) and a shunt coupled capacitor C6. A first terminal of a capacitor C6 may be coupled to either the first or the second terminal of inductor L5. A second terminal of capacitive C6 is coupled to a reference potential $V_{REF}$ through a switch S3. Reconfigurable filter circuit 89 thus comprises at least one switchable signal path (i.e. a signal path comprising a switching element S3). In the illustrative embodiment of FIG. 8D, reconfigurable filter circuit 89 comprises a single switch coupled between a terminal of capacitor C6 and the reference potential $V_{REF}$ Those of ordinary skill in the art will appreciate, of course, that the positions of capacitor C6 and switch S3 can be reversed (i.e. a first terminal of switch S3 may be coupled to either the first or the second terminal of inductor L5 and a second terminal of switch S3 may be coupled to a first terminal of capacitor C6 while a second terminal of capacitor C6 is coupled to the reference potential $V_{REF}$). After reading the disclosure provided herein, those of ordinary skill in the art will also appreciate that the reference potential $V_{REF}$ may correspond to ground or some positive or negative potential (e.g. any positive or negative voltage). The particular reference potential $V_{REF}$ to use is selected to suit the needs of a particular application.

In practical systems, the switches may be switched between their "on" and "off" states on timescale consistent with the time required to make a determination of load impedance characteristics and/or performance characteristics of the RF amplifier and/or of performance characteristics of the RF transmit system taken over a period of time (and thus, this would be considered a relatively slow time scale when compared to the switching speed of a switch). In embodiments, the switches may be switched between their "on" and "off" states in response to average characteristics of any or all of: (1) load impedance characteristics; and/or (2) performance characteristics of the RF amplifier and/or (3) of performance characteristics of the RF transmit system. In some embodiments, the switches may be switched between their "on" and "off" states in response to substantially instantaneous impedance changes (i.e. the switch states may be changed as quickly as impedance changes can be identified) rather than on a slower timescale (i.e. slower relative to an instantaneous time scale) such as in response to average characteristics).

Referring now to FIG. 8D, a reconfigurable filter circuit 86 having first and second terminals 86*a*, 86*b* includes a series coupled inductor L4 (i.e. inductor L4 is serially coupled between terminals 86*a*, 86*b* of filter circuit 86). A first terminal of a resistor R2 is coupled to a first one of first and second terminals of inductor L4. A second terminal of resistor R2 is coupled to a variable capacitive network 88 capable of providing a variable capacitance. Variable capacitance network 88 comprises at least one switchable signal path (i.e. a switching path comprising a switching element). In the illustrative embodiment of FIG. 8C, variable capacitance network comprises three signal paths of which two are switchable signal paths. The switchable signal path (e.g. switchable elements S1, S2) may be switched in accordance with any of the techniques described above in conjunction with FIG. 8C.

In particular, network 88 includes one or more capacitors (with three capacitors being shown in this illustrative embodiment) coupled between a resistor and a reference potential (here the reference potential corresponding to ground). At least one capacitor in network 88 is coupled to a switch. The switch may be arranged (i.e. disposed on either side of the capacitor) such that the switch operates to make or break an electrical conduction between either the resistor and the capacitor or between the capacitor and a reference potential $V_{REF}$.

In this illustrative embodiment, a pair of switches S1, S2 are serially coupled between respective ones of capacitors C3, C5 and the reference potential. In response to a switch providing a low impedance signal path between a capacitor and the reference potential (i.e. in response to the switch being "closed"), a reconfigurable filter circuit 86 has a first filter characteristic. In response to a switch providing a high impedance signal path between the capacitor and the reference potential (i.e. in response to a switch being "open"), the reconfigurable filter circuit 86 has a second, different filter characteristic.

In general, each switchable signal path with 2 states (i.e. on and off) provides two different filter characteristics. In general, for N switchable signal paths each having 2 states, $2^N$ different filter characteristics are possible.

If an impedance of an RF load coupled to an output of an RF amplifier (e.g. RF amplifier 24 described above in conjunction with FIG. 1) changes or is continually varying, the operating characteristics of the RF amplifier will also change (i.e. a varying load impedance affects the operation and thus performance of the RF amplifier). By using a reconfigurable filter circuit, the filter and/or impedance characteristic of the reconfigurable filter circuit can be changed to achieve or maintain a desired performance by the RF amplifier (e.g. in response to varying RF load characteristics.

As noted above in conjunction with FIG. 8C, in practical systems, the switches may be switched between their "on" and "off" states on timescale consistent with the time required to make a determination of load impedance characteristics and/or performance characteristics of the RF amplifier and/or of performance characteristics of the RF transmit system taken over a period of time (and thus, this would be considered a relatively slow time scale when compared to the switching speed of a switch). In embodiments, the switches may be switched between their "on" and "off" states in response to average characteristics of any or all of: (1) load impedance characteristics; and/or (2) performance characteristics of the RF amplifier and/or (3) of performance characteristics of the RF transmit system. In some embodiments, the switches may be switched between their "on" and "off" states in response to substantially instantaneous impedance changes (i.e. the switch states may be changed as quickly as impedance changes can be identified) rather than on a slower timescale (i.e. slower relative to an instantaneous time scale) such as in response to average characteristics).

Although in the illustrative embodiment of FIG. 8D, the network 88 includes three parallel coupled capacitors with one capacitor coupled directly to a reference potential (here illustrated as ground) and two capacitors coupled to a reference potential (here illustrated as ground) through a switch, those of ordinary skill in the art will appreciate that reconfigurable filter circuit 86 may be provided from a wide range of other circuit implementations.

For example, and with reference now to FIG. 8E, a reconfigurable filter circuit 90 having first and second terminals 90*a*, 90*b* includes a plurality of impedance elements 92, 94 having a plurality of switched impedance elements 95*a*-95*n* coupled thereto. Each of the switched impedance elements 95*a*-95*n* includes at least one impedance element 96, 100, 104 which may comprise, for example, lossless elements, including inductors and capacitors, and may further include lossy elements, such as resistors and magnetic beads. The switched impedance elements 95*a*-95*n* also include one switch element 98, 102, 106 capable of switching at least a respective one of impedance elements 96, 100, 104 in a manner which changes the impedance presented by a PSN stage of which the reconfigurable filter circuit 90 is a part.

Figure 10:
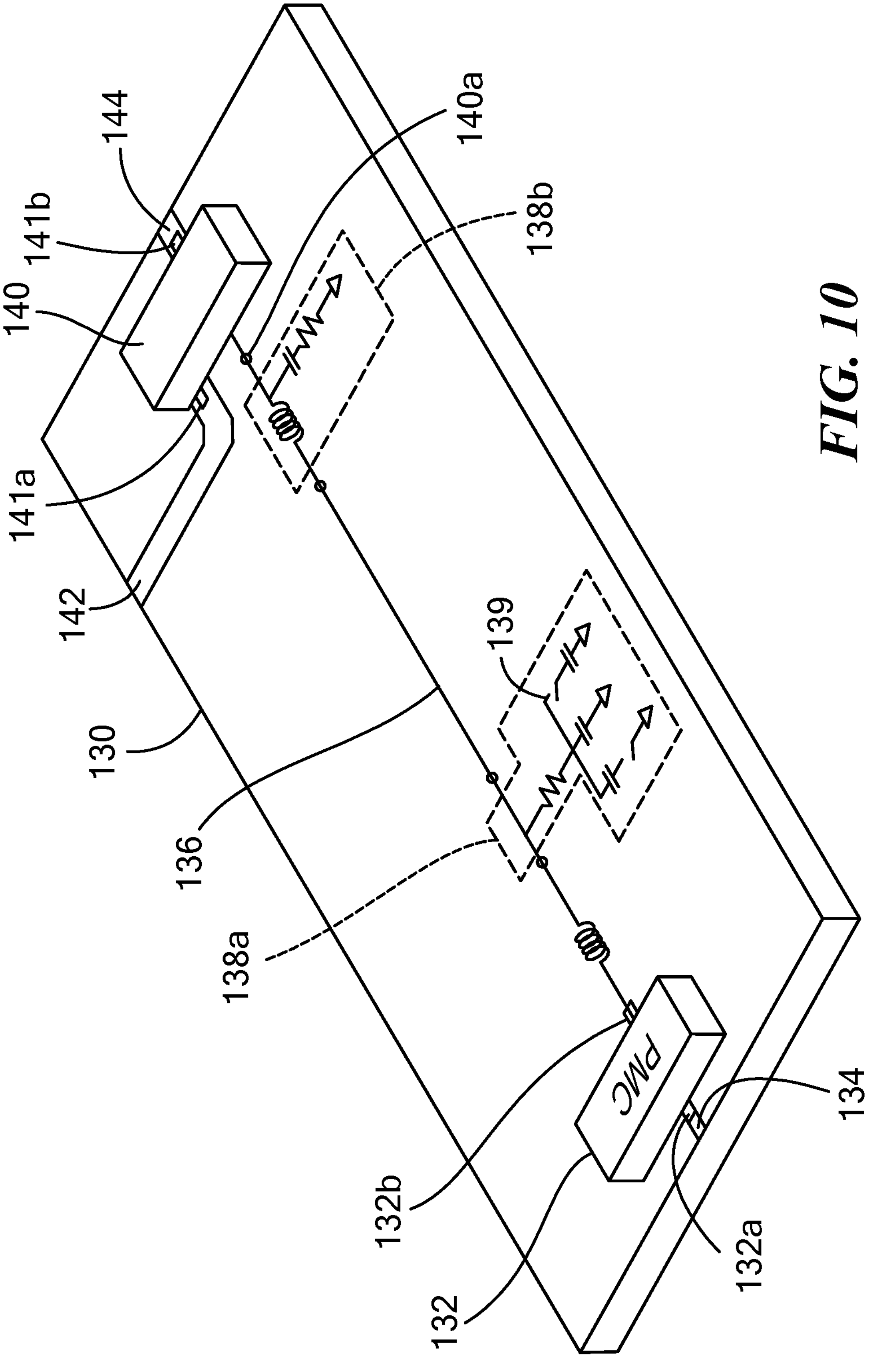
FIG. 10 is a block diagram of an illustrative hybrid circuit having a PMC coupled to a multi-stage PSN.
Figure 10A:
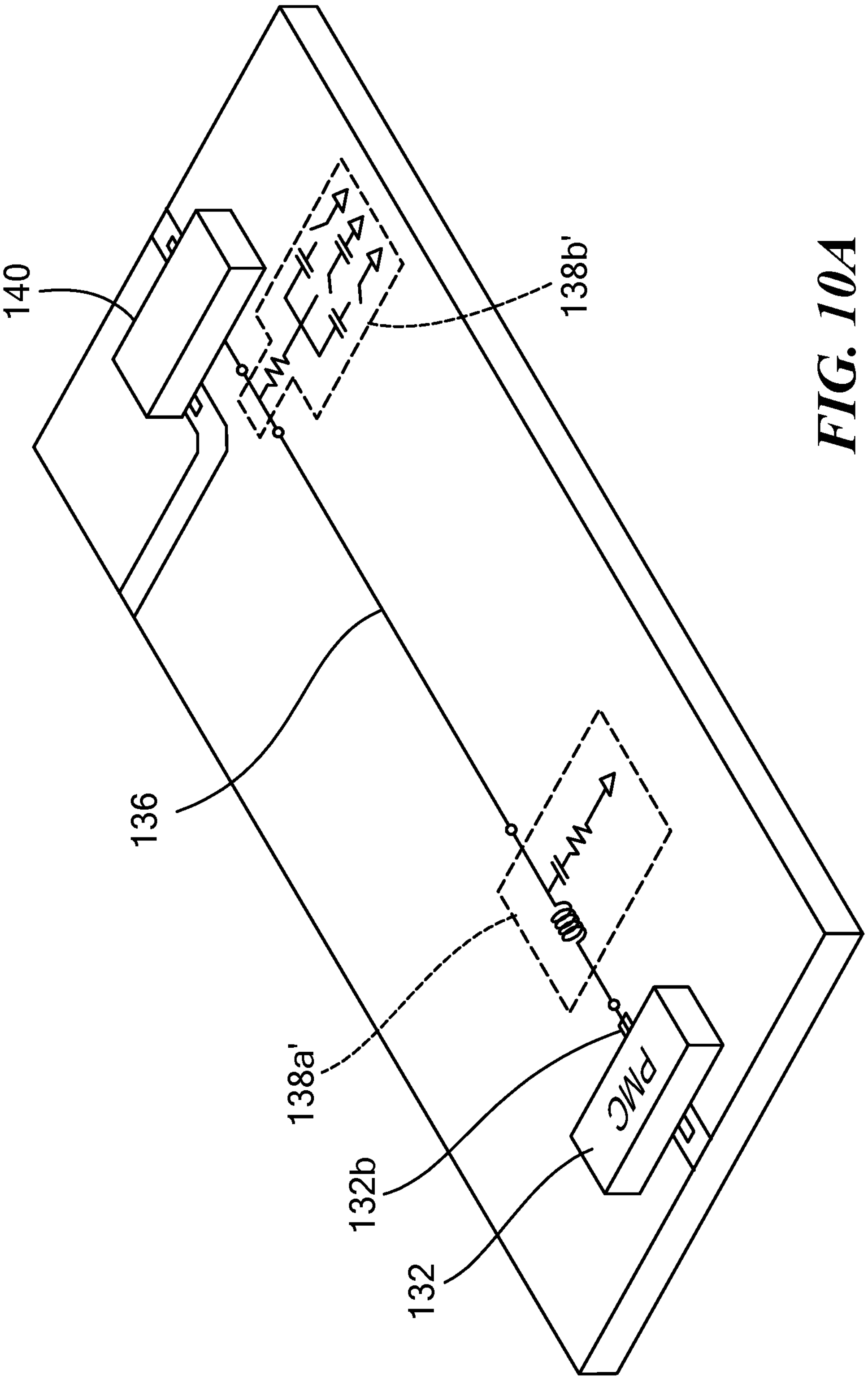
FIG. 10A is a block diagram of an alternate illustrative hybrid circuit having a PMC coupled to a multi-stage PSN.

It should be appreciated that, in general, at least one switch element is configured to selectively couple at least one reactive element between a reference potential and at least one of the first and second terminals of the reconfigurable filter circuit. For example, in embodiments, the positions of the reactive and switch elements (e.g. elements 96, 98 in FIG. 8D) may be reversed such that the switch element (e.g. switch element 98) has a first terminal coupled to one of the first and second filter terminals and a second terminal coupled to a first terminal of a reactive element (e.g. reactive element 96). A second terminal of the reactive element (e.g. reactive element 96) is coupled to a reference potential. An example of such a configuration is shown in FIGS. 10 and 10A.

It should further be understood that by placing switches in each of the two or more signal paths one of a plurality of different filtering characteristics over a predetermined RF frequency band can be provided. The switches may be operated independently to provide a desired filter characteristic. For example with N switchable signal paths (with N being an integer greater than or equal to 1), the reconfigurable filter circuit is capable of providing up to $2^N$ different filter characteristics.

In embodiments, at least one of the at least two or more signal paths comprises a switch element having a first terminal coupled to one of the first and second terminals of the reconfigurable filter circuit and a second terminal coupled to a first terminal of one of the reactive elements.

By providing a switch element coupled between one of the reconfigurable filter circuit terminals and a reactive element, the impedance of characteristic of the reactive element can be switched into and out of the filter circuit (thus making the filter circuit reconfigurable). In one embodiment, by placing the switch in a first switch position (e.g. a closed position such that the switch provides a low impedance signal path between the reactive element and one of the reconfigurable filter circuit terminals), the reconfigurable filter circuit is provided having a first filter characteristic and by placing the switch in a second, different switch position (e.g. an open position such that the switch provides a high impedance signal path between the reactive element and one of the reconfigurable filter circuit terminals), the reconfigurable filter circuit is provided having a second, different filter characteristic within the desired frequency band.

In embodiments, a second terminal of one of the reactive elements is coupled to a reference potential $V_{REF}$ (which may, for example, be ground).

Figure 9:
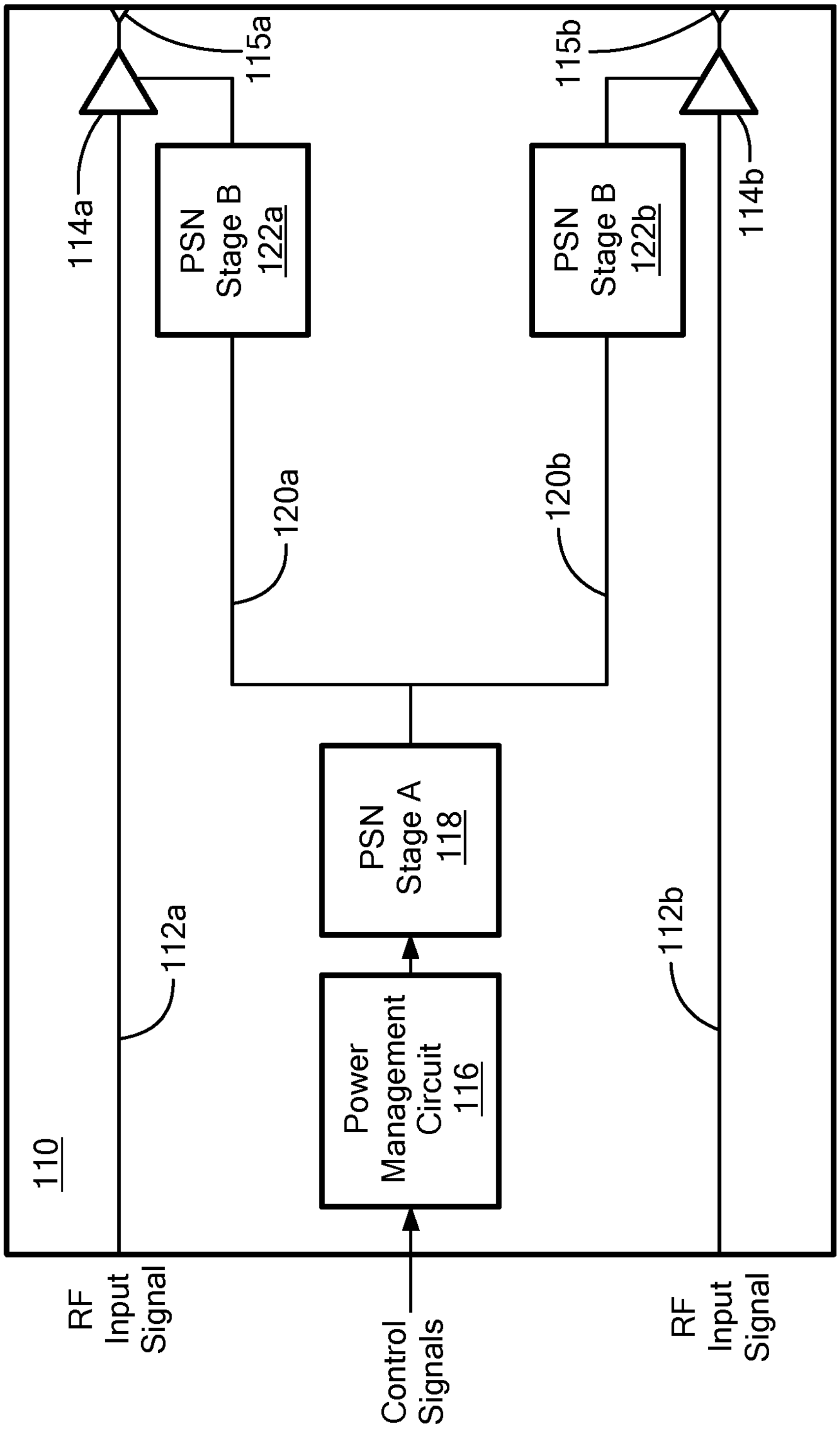
FIG. 9 is a block diagram of an illustrative integrated circuit (IC) having a split PSN.

Referring now to FIG. 9, a multiple-input, multiple-output (MIMO) transmit circuit implemented as an integrated circuit (i.e. a monolithic integrated circuit) 110 includes a pair of RF power amplifiers 114*a*, 114*b* having RF inputs to which RF signals are provided though signal paths 112*a*, 112*b*. Transmit circuit 110 further includes a PMC 116 (which may be functionally the same as or similar to any of the PMCs described above) having an input configured to receive information (e.g. control signals) provided thereto (e.g. from a controller such as controller 14 described above in conjunction with FIG. 1). In response to such control signals, PMC is configured to provide variable supply bias voltage signals though a first stage 118 of a PSN. First PSN stage 118 appropriately processes the signals (e.g. via a filtering or partial filtering operation) and provides appropriately processed supply bias voltage signals along signal paths 120*a*, 120*b* to respective ones of second PSN stages 122*a*, 122*b*. Second PSN stages 122*a*, 122*b* further process the signals provide thereto (e.g. via a filtering or partial filtering operations) and provides appropriately processed (e.g. appropriately filtered) supply bias voltage signals to supply terminals of respective ones of RF amplifiers 114*a*, 114*b*.

As noted above, the respective RF amplifiers 114*a*, 114*b*, receive RF signals along respect RF signal paths 112*a*, 112*b*, amplify the signals and provide the amplified RF signals to respective ones of antennas 115*a*, 115*b* through which an RF transmit signal is emitted.

It should be noted that PMC 116 and PSN Stage A 118 are located a significant distance from PSN Stages B 122*a*, 122*b* and the associated PAs 114*a*, 114*b*. In the illustrative embodiment of FIG. 9, PMC 116 and Stage A 118 are located at one end of IC 110 while Stages B 122*a*, 122*b* and the associated PAs 114*a*, 114*b* are located at substantially the opposite end of IC 110.

As noted above, by physically dividing the PSN into multiple stages (here two stages comprised of first stage 118 and second stages 122*a*, 122*b*), it is not necessary to reproduce components of the first PSN stage (i.e. Stage A). This approach reduces the amount of are a required on the IC to accommodate the PSN and affords the flexibility to place relatively large PSN components (i.e. PSN components which require a relatively large amount of real estate on an integrated circuit (IC)) in areas of the IC better able to accommodate the larger circuit structures.

Furthermore, with this multi-stage PSN approach, it is possible to control receive baseband (RxBN) and out of band emissions for discrete supply modulation transmitters while maintaining linearity and efficiency while also accommodating a plurality of RF amplifiers (e.g. a plurality of RF PAs) which are physically distant from the PMC on an IC in a cost-effective manner and which is suitable for a mobile device form factor.

It should be appreciated that although the embodiment of FIG. 9 is here illustrated as an integrated circuit, the circuit may also be implemented using a mixture of (i.e. a combination of) discrete circuit elements and integrated circuits. Examples of such embodiments are described hereinbelow in conjunction with FIGS. 10-11.

Figure 9A:
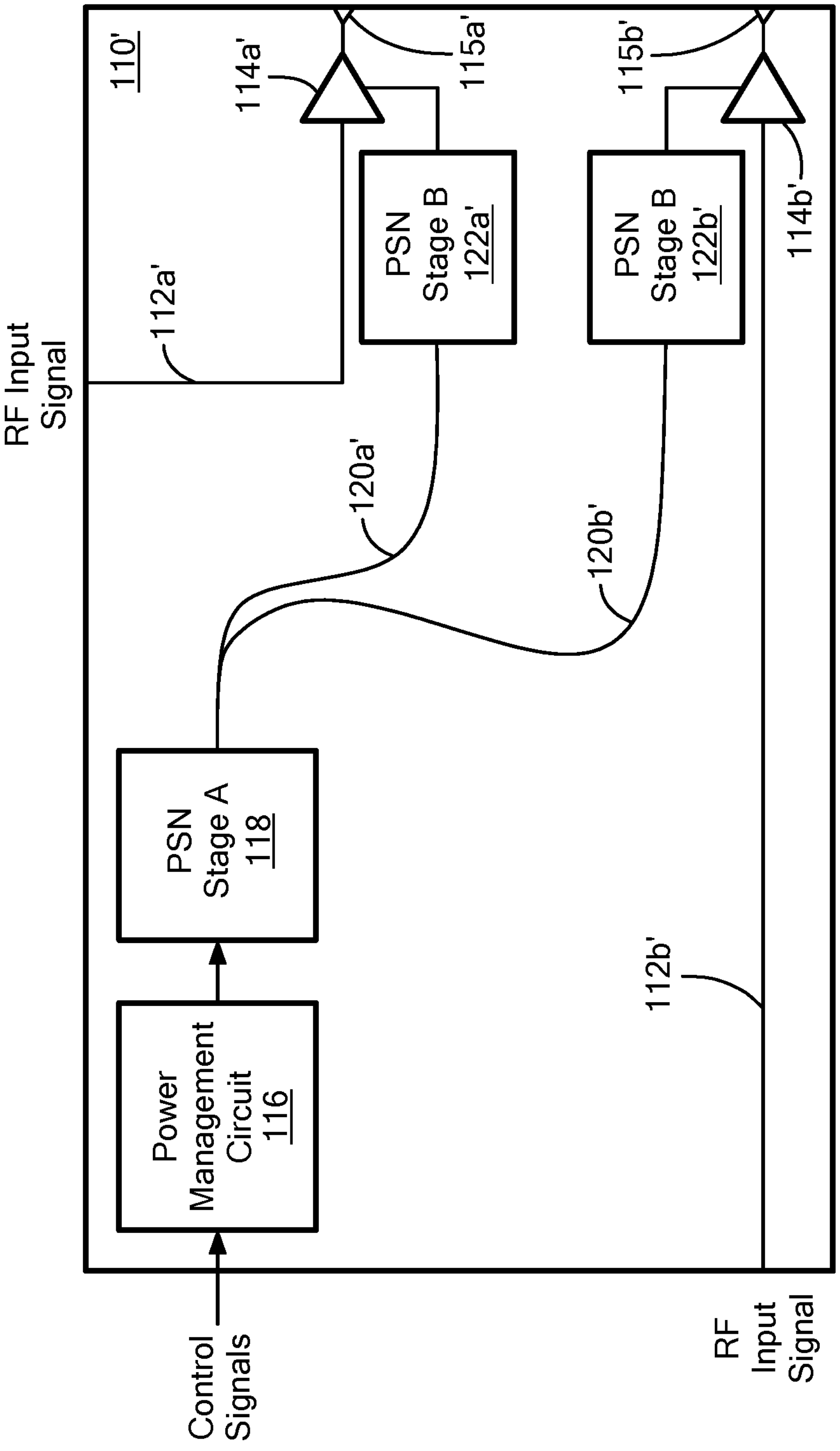
FIG. 9A is a block diagram of an illustrative IC having a split PSN.

Referring now to FIG. 9A, in which like elements of FIG. 9 are provided having like reference designations, a transmit circuit implemented as an integrated circuit 110' includes curved signal paths 120*a*', 120*b*'. In some embodiments it may be desirable or even necessary (e.g. due to circuit layout constraints or other factors) to include relatively long signal paths having curves or other non-straight line shapes. Signal paths having lengths which give rise to parasitic inductances and/or capacitances and/or resistances (sometimes simply referred to as "parasitics") are sometimes referred to as "long" signal paths. Long signal paths having curves or other shapes may particularly give rise to parasitic inductances and/or capacitances and/or resistances. The effect of such parasitic s may be further increased or enhanced when long signal paths exist and even further increased when long curved signal paths exist.

As noted above PMC 116 and Stage A 118 are located a significant distance from Stages B 122*a*', 122*b*' and the associated PAs 114*a*, 114*b*. In the illustrative embodiment of FIG. 9A, PMC 116 and Stage A 118 are located at one end of IC 110' while Stages B 122*a*', 122*b*' and the associated PAs 114*a*', 114*b*' are located at substantially the opposite end of IC 110. Thus, the length of signal paths 122*a*', 122*b*' is significant and parasitics may arise due to the shape and/or physical length of the signal path between the first and second PSN stages. As noted above, such parasitic inductances and/or capacitances may be used in the design of PSN stages such as the first and/or second PSN stages.

Thus, in this embodiment, the impedance characteristics of the first PSN stage 118 and/or second PSN stages 122*a*', 122*b*' may incorporate the parasitics which arise due to one or both of signal paths 122*a*', 122*b*'.

Referring now to FIG. 10, substrate 130 has disposed thereon a PMC 132 which may be the same as or similar to any of the PMC's described hereinabove. In embodiments, the substrate may be provided as a printed circuit board (PCB) provided from any suitable single or multilayer dielectric material (e.g. a glass fiber reinforced epoxy resin based material or low temperature or a low temperature co-fired ceramic (LTCC) material with conductive layers provided therein or on exposed surfaces thereof).

In the illustrative embodiment of FIG. 10, the PMC is implemented as an integrated circuit disposed in an IC package, which may be, for example, a leadframe package, a substrate package, a wafer-level package or any other type of IC package known to those of ordinary skill in the art.

The PMC includes an input 132*a* coupled to an input signal path 134 provided on the PCB (e.g. the signal path is etched or otherwise provided as part of the PCB using additive or subtractive processes as is generally known). PMC input 132*a* is configured to receive control signals from a controller (such as controller 14 described herein above in conjunction with FIG. 1). PMC 132 also includes an output 132*b* coupled to a supply bias voltage signal path 136. Signal path 136 may be etched or otherwise provided as part of the PCB using any additive or subtractive process known to those of ordinary skill in the art. Supply bias voltages are provided at PMC output 132*b* as discussed hereinabove.

A first stage 138*a* of a PSN 138 is coupled to the supply voltage signal path. The first PSN stage may be implemented using discrete elements electrically coupled to each other and to the supply voltage signal path. A second stage of the PSN is coupled to the supply voltage signal path. The second PSN stage may be implemented using discrete elements electrically coupled to each other and to the supply voltage signal path. Thus, the circuit of FIG. 10 represents a hybrid circuit implementation which may include both integrated circuits (e.g. PMC and RF amplifier) as well as discrete elements (e.g. the first and second PSN stages).

In embodiments, the first PSN stage is physically proximate the PMC. In embodiments (and as shown and described in conjunction with FIG. 11), the first PSN stage may be included as part of a PMC module (e.g., a single package which includes a PMC and the first stage PSN, regardless of the manner in which either the PMC or first PSN stage are implemented). In this illustrative embodiment, first PSN stage 138*a* comprises a reconfigurable filter circuit 139 which functions in a manner similar to the reconfigurable filter circuit 88 described above in conjunction with FIG. 8C.

In embodiments, the second PSN stage is physically proximate the amplifier bias terminal. In embodiments (and a shown in FIG. 11), second PSN stage may be included as part of an amplifier module (e.g. a single package which includes an RF amplifier and the second stage PSN). While the first PSN Stage 138*a* comprises active components (i.e. switches), the second PSN stage comprises only passive components and is implemented as circuit 80 described above in conjunction with FIG. 8.

The supply voltage signal path 136 is coupled to a supply terminal 140*a* (or bias terminal) of an RF amplifier 140 disposed on the PCB. Thus, supply voltage signals are provided from the PMC to the RF amplifier bias terminal through the supply voltage signal path 136.

The RF amplifier has an RF input 141*a* coupled to an RF input signal path 142 provided on the PCB and an RF output coupled to an RF output signal path 144 provided on the PCB. The RF amplifier may be the same as or similar to any of the RF amplifiers described herein above.

Referring now to FIG. 10A in which like elements of FIG. 10 are provided having like reference designations, in this illustrative embodiment, the first PSN stage 138*a'* comprises all passive components while the second PSN stage 138*b'* comprises active components (i.e. the switches).

It should be further understood that in some applications, it may be desirable to provide both the first and second PSN stages having all passive components. In still other applications, it may be desirable to provide both the first and second PSN stages having at least one active component (e.g. at least one switchable element such as a switch comprising a transistor or a diode).

Figure 11:
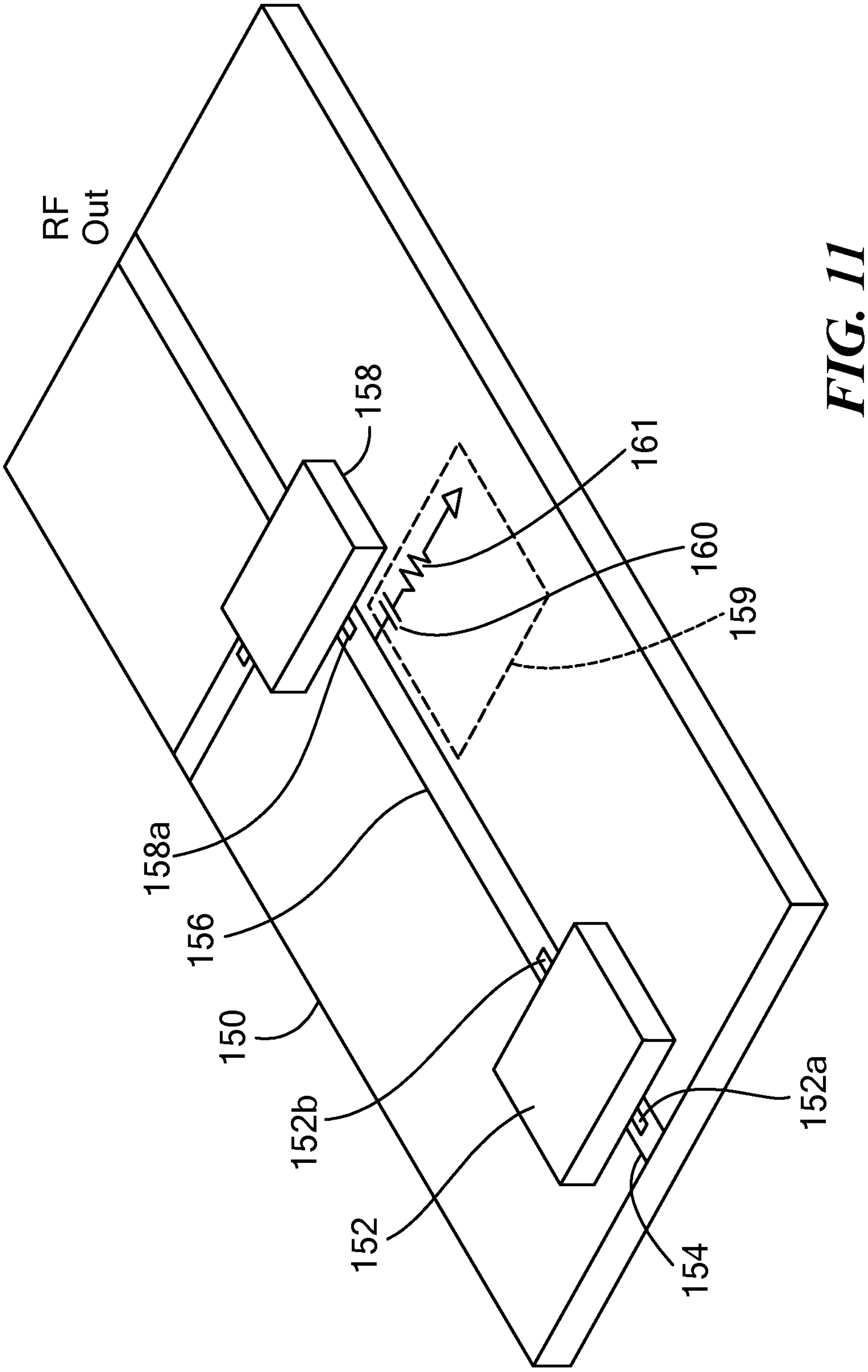
FIG. 11 is a block diagram of an illustrative circuit having a PMC module and an RF amplifier module with at least one of the modules comprising at least a portion of a multi-stage PSN.

Referring now to FIG. 11, a substrate 150 (which may be any of the types described above in conjunction with FIGS. 9-10A) has disposed thereon a PMC module 152. PMC module 152 comprises a PMC and the first PSN stage (i.e. the PMC module is a single package which includes a PMC and at least a portion of a first PSN stage regardless of the manner in which either the PMC or first PSN stage are implemented). In embodiments one or both or portions of either of the PMC and first PSN stage may be implemented as integrated circuits or may be implemented using discrete elements (i.e. discrete circuit components).

The PMC module 152 includes an input 152*a* coupled to an input signal path 154 provided on the PCB (e.g. the signal path is etched or otherwise provided as part of the PCB using additive or subtractive processes as is generally know) and configured to receive control signals from a controller (such as controller 14 described herein above in conjunction with FIG. 1). The PMC module also includes an output 152*b* coupled to a supply voltage signal path 156 (e.g. signal path is etched or otherwise provided as part of the PCB using additive or subtractive processes as is generally know) and at which supply bias voltages are provided as discussed hereinabove.

Also disposed on the substrate is an RF amplifier module 158 comprising an RF amplifier and a portion of a second PSN stage (i.e. a single package which includes an RF amplifier and at least a portion of the second PSN stage regardless of the manner in which either the RF amplifier or second PSN stage are implemented).

In the illustrative embodiment of FIG. 11, a first portion 159 of a second PSN stage comprises a capacitor 160 and inductor 161 serially coupled between supply voltage signal path 156 and a reference potential (here illustrated as ground) second PSN stage portion 159 is coupled proximate bias terminal 158*a* of RF amplifier module 158. A second portion of the second PSN stage is provided as part of the RF amplifier module and thus is not visible in FIG. 11.

It should be appreciated that in embodiments, the entire second PSN stage may be provided as part of the switch module. In embodiments, one or both of the RF amplifier and the second PSN stage (including all or portions of the second PSN stage) may be implemented as integrated circuits or may be implemented using discrete elements (i.e. discrete circuit components).

Figure 11A:
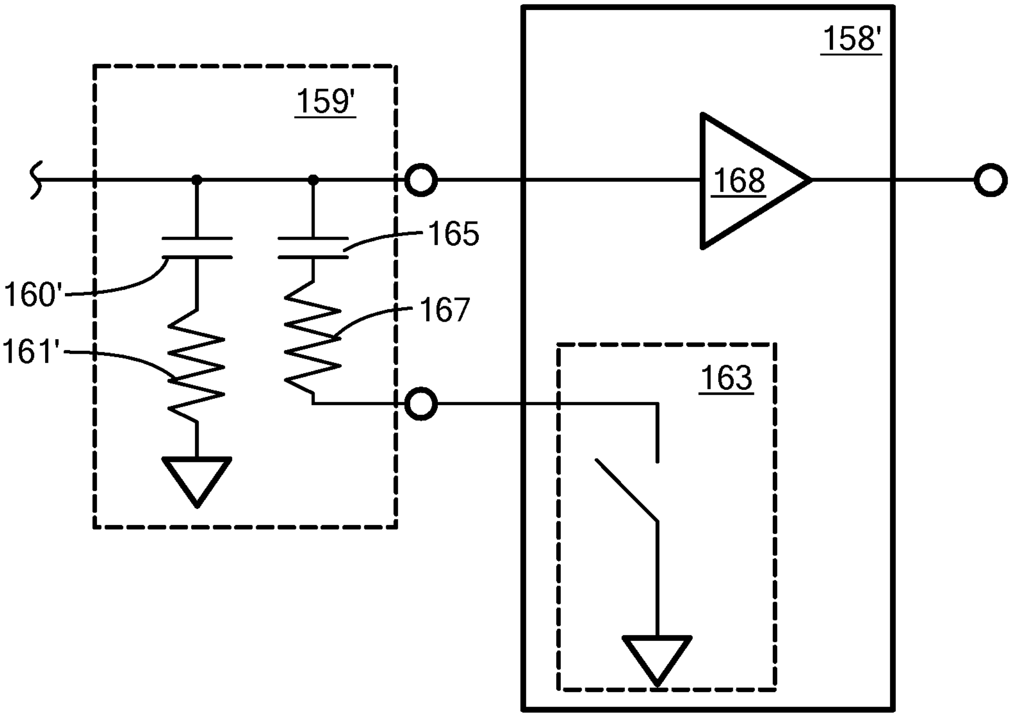
FIG. 11A is a schematic diagram of a portion of an RF amplifier module comprising a portion of a multi-stage PSN.

As may be more clearly understood from FIG. 11A, in embodiments an RF amplifier module 158' includes a switch which, together with capacitor 165 and resistor 167 form a switchable signal path portion of a second PSN stage 159'. Thus, in this embodiment, second PSN Stage 159' comprises capacitor 160' and a switchable signal path portion comprising capacitor 165, resistor 167 and switch 163 and a portion of the second PSN stage is realized as (i.e. is implemented as part of) the switch module.

It should thus also be appreciated that a similar approach may be used with the first PSN stage. That is, in embodiments in which the first PSN stage comprises, switches, all of some of the one or more switches may be realized as (i.e. implemented as part of) the PMC module.

It should also be appreciated that the supply voltage signal path (e.g. path 136 in FIG. 10, 10A or path 156 in FIG. 11) may have the impedance characteristics of an inductor (i.e. the supply voltage signal path may electrically appear as a distributed inductive element). Thus, any inductive characteristics of the supply voltage signal path may be absorbed or at least taken into account in the component selection for the first and second PSN stages.

Figure 12A:
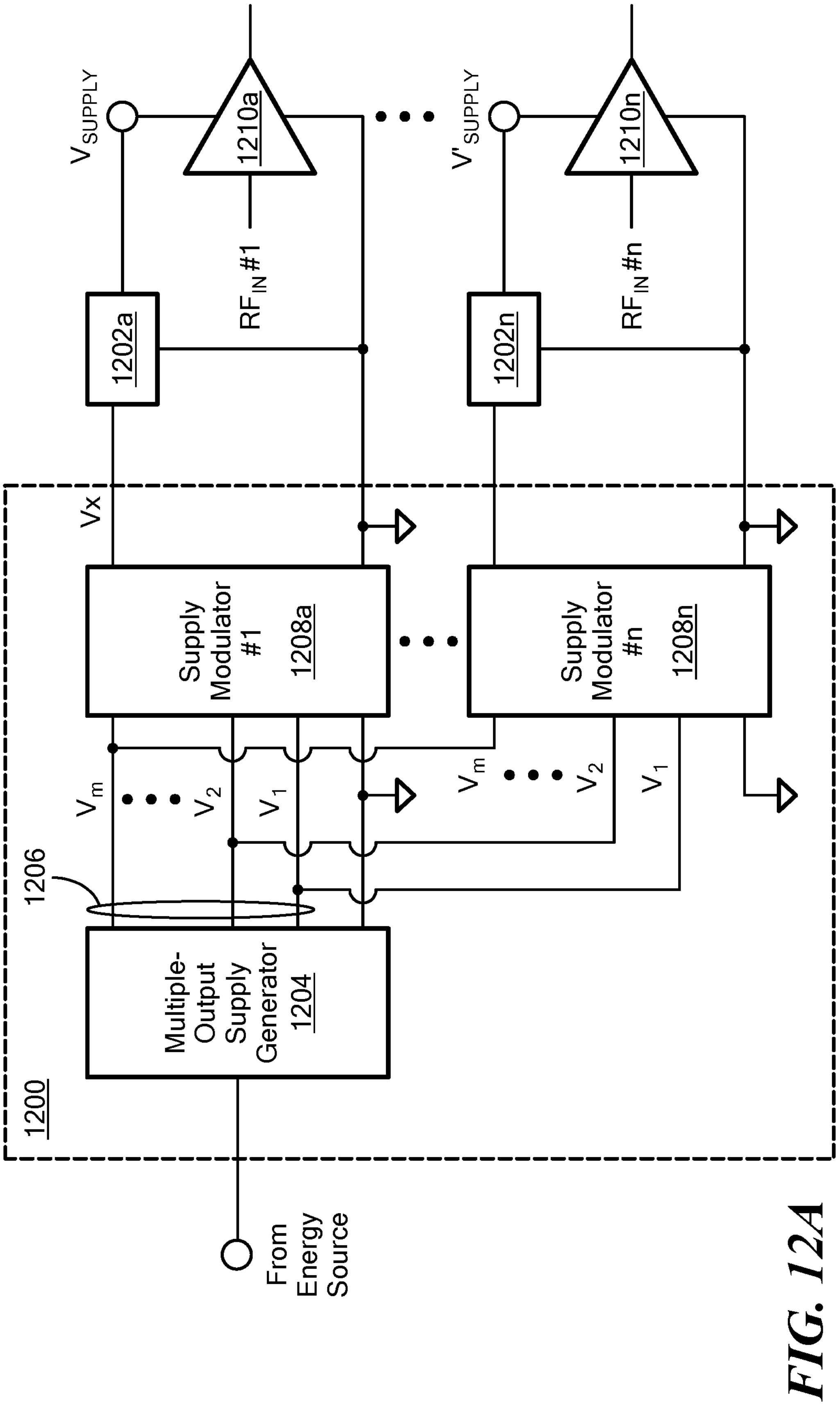
FIG. 12A is a block of a supply modulated RF power amplifier circuit having at least one PSN.

Referring now to FIG. 12A, a power management circuit (PMC) 1200 comprises at least one multiple-output supply generator (also sometime referred simply as a "multi-output power supply) 1204 having multiple output terminals 1206 at which one or more output signals (e.g. one or more voltage signals or more simply, one or more voltages) are provided. PMC 1200 also comprises one or more supply modulators 1208*a*-1208*n* having inputs configured to receive the multiple-output supply generator output signals (e.g., voltage signals or more simply voltages). One or more PSNs 1202 may be coupled to PMC 1200. In embodiments, PSN filters or modifies the trajectory of signals provided thereto and may be provided as part of the PMC. In embodiments, the PSNs may comprise a filter network (i.e. a group of circuit components which are coupled to provide a filter function).

As described above, PMC 1200 may include a multiple-output supply generator 1204 with multiple output terminals 1206 at which voltages $V_1$-$V_m$ may be provided. Voltages $V_1$-$V_m$ may all be different or some or all of the voltages may be the same.

The supply generator output terminals 1206 may be coupled to one or more supply modulators 1208*a*-1208*n*. As illustrated in FIG. 12A, each supply modulator 1208*a*-1208*n* receives one or more of voltages $V_1$-$V_m$ at inputs thereof. In embodiments, supply modulators 1208*a*-1208*n* need not be coupled to each of the outputs 1206. Rather, the supply modulators may be coupled to all or some of the outputs 1206. Thus, supply modulators 1208*a*-1208*n* may receive one, some or all voltages $V_1$-$V_m$.

Supply modulators 1208, in embodiments, may modulate the input voltages $V_1$-$V_m$ provided thereto and produce an output voltage signal $V_x$ which, as noted above, may be a switched voltage signal that includes variations and pulses in its voltage level. PSNs 1202*a*-1202*n* receive respective output voltage signal Vx provided thereto and may apply filtering or other pulse shaping techniques to the output voltage signal Vx to produce respective supply voltage signals $V_{SUPPLY}$. Supply voltage signals are provided to ones of the RF power amplifiers 1210*a*-1210*n*.

In different configurations, PMC 1200 may provide power to multiple power amplifiers. That is, in this example embodiment, PMC 1200 is provided as a multi-output PMC. In the example embodiment of FIG. 12A, there is a second power amplifier 1210*n* receiving power from PMC 1200. Accordingly, PMC 1200 includes a second supply modulator 1208*n* and a second PCN 1202*n* coupled to generate a voltage signal V' SUPPLY that provides power to RF power amplifier 1210*n*.

Although only one multi-output supply generator is illustrated in FIG. 1, in embodiments, the system may include a plurality of multi-output power supplies. Further, in embodiments, at least some of the plurality of modulator circuits the one or more modulator circuits 1208*a*-1208*n* may have an input coupled to respective ones of the plurality of multi-output power supplies and the switching network is configured to selectively couple any of (e.g., one or more of) the plurality of modulator circuits 1208*a*-1208*n* to the bias terminal of one or more of the plurality of RF amplifiers 1210*a*-121. Thus, in embodiments, one, some or each supply modulator may be coupled to its own multi-output power supply.

Figure 12B:
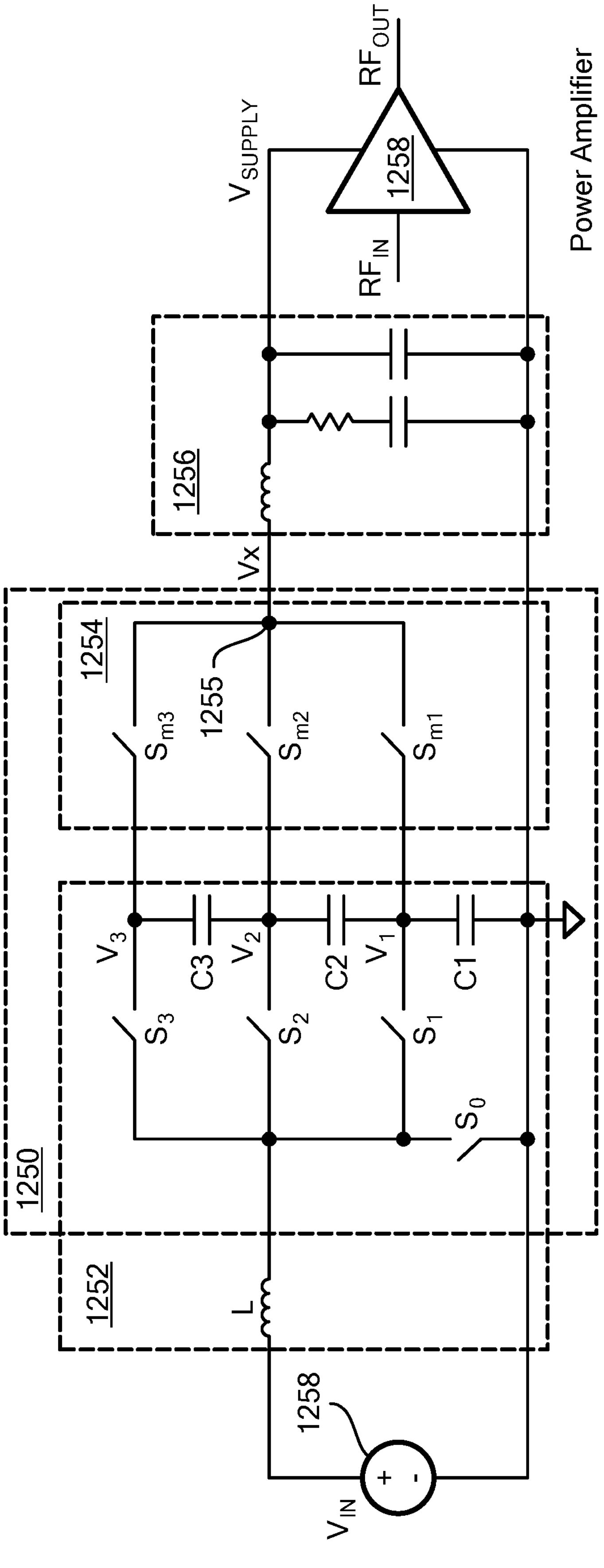
FIG. 12B is a schematic diagram of a supply modulated RF power amplifier circuit.

FIG. 12B is a circuit diagram of an example PMC 1250, which may be functionally the same as or similar to PMC 1200 described above in conjunction with FIG. 12A. PMC 1250 includes a multiple-output supply generator 1252 coupled to a supply modulator 1254. In this example embodiment, supply generator provides supplies voltages $V_1$, $V_2$, and $V_3$ to supply modulator 1254. In general, however, supply generator may provide any number of voltages to suit the needs of a particular application.

In this configuration, the multiple-output supply generator 1252 functions as a boost converter that produces multiple outputs (e.g., at different voltage levels $V_1$, $V_2$, $V_3$) from a voltage supply 1258. In contains one or more inductors L, one or more capacitors C1, C2, and C3, and one or more switches that charge the capacitors $S_1$, $S_2$, and $S_3$. A first terminal of inductor L is coupled to voltage supply 1258 and a second terminal of inductor L is selectively coupled to a reference potential (e.g., to draw current through the inductor L). In this example embodiment, switch $S_0$ may be opened/closed to selectively couple inductor L to a reference potential (here illustrated as ground) to draw current through the inductor L. A controller (not shown) then opens $S_0$ and selectively closes the switches $S_1$, $S_2$, and $S_3$ so that the current through L charges the capacitors C1, C2, and C3 to the desired voltage levels. In other embodiments, other voltage regulation circuits may be used in replace of or in addition to the boost circuit shown in FIG. 12B to produce the multiple voltage outputs $V_1$, $V_2$, $V_3$. This may include switched capacitor circuits and hybrid magnetic/switched capacitor circuits (e.g., a magnetic/switched-capacitor converter).

It should be understood that although in this example embodiment, the reference potential is ground, in other embodiments, other reference potentials may be used to draw current through inductor L. For example, the switches could be opened/closed such that switches S1 or S2 establish a reference potential used to draw current through inductor L.

In the example of FIG. 12B, supply modulator 1254 includes a plurality of switches coupled or otherwise configured to operate as a multiplexor. A controller (not shown) selectively closes one of the switches $S_{m1}$, $S_{m2}$, or $S_{m3}$ which couples a respective voltage $V_1$, $V_2$, $V_3$ to node 1255 at which voltage signal $V_x$ is provided.

As is known in the art, abrupt switching of voltage signals can introduce undesirable signal elements such as ringing, voltage peaks above or below an operating threshold, etc. These signal elements often occur at frequencies higher than the modulation or switching frequency. Thus, in this example, the PSN 1256 comprises circuit elements arranged to act as a filter. In this example embodiment PSN is provided having a low pass filter characteristic. In other embodiments, PSN 1256 may be provided having other or additional filter characteristics (e.g. bandpass, high-pass, notch, or other filter characteristics). In the example of FIG. 12B, PSN 1256 comprises an LC low-pass filter configured to remove high-frequency content from and smooth the edges of the switched voltage signal Vx. $V_{SUPPLY}$, the output of the low-pass filter, is coupled to RF power amplifier 1258 e.g. to a supply terminal of PA 1258. In this way, PA 1258 receives a modulated voltage at a supply terminal thereof.

Figure 13:
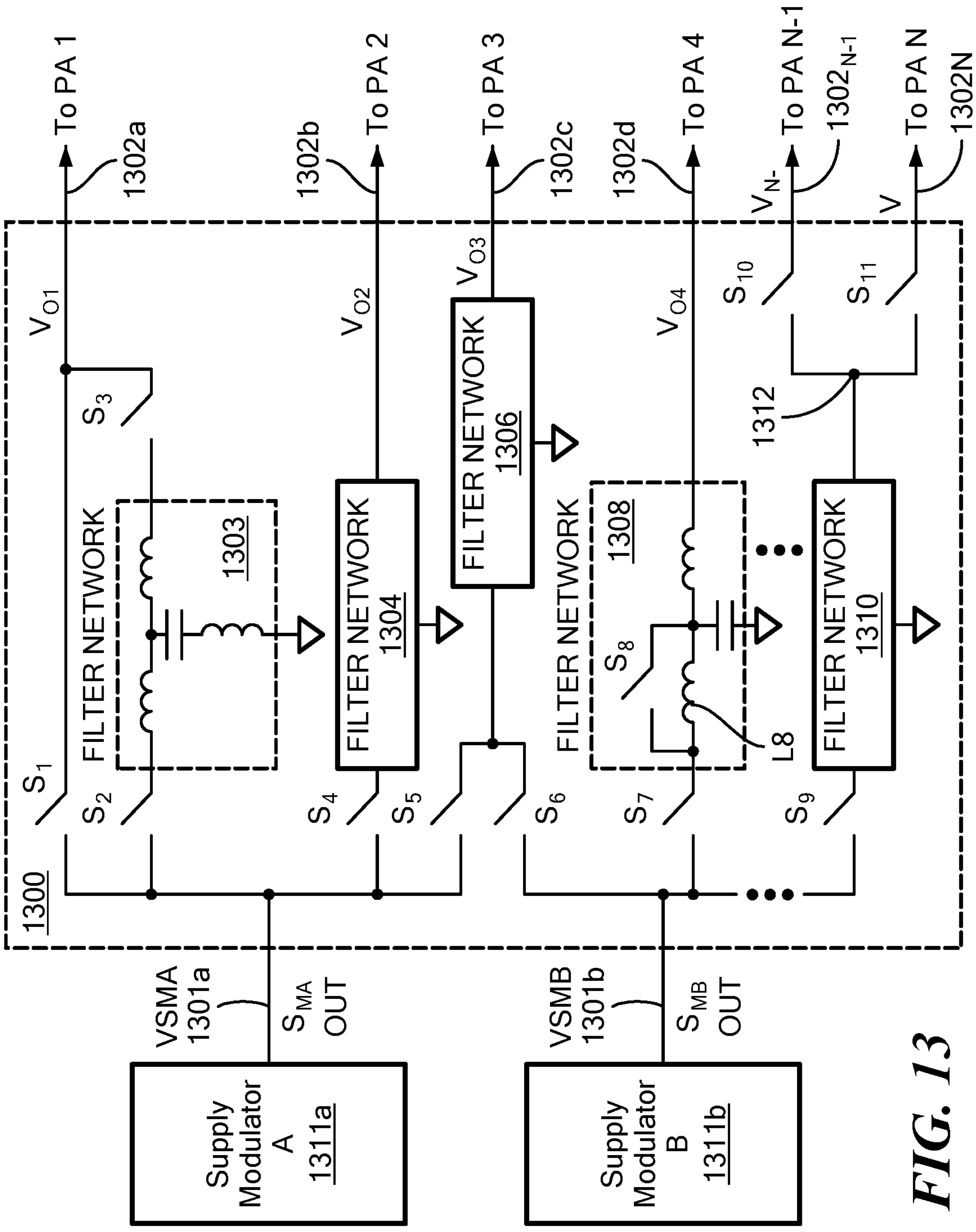
FIG. 13 is a schematic diagram of a switching network coupled to one or more supply modulators.

Referring now to FIG. 13, a switching network 1300 has one or more inputs each of which may be coupled to one or more supply modulators with two supply modulators 1311*a*, 1311*b* being shown in the example embodiment of FIG. 13. In some implementations, the switching network 1300 may be coupled in a cascaded configuration with the supply modulators 1311*a*, 1311*b*. In this example embodiment, switching network 1300 comprises two inputs 1301*a*, 1301*b* coupled to outputs of respective ones of supply modulators 1311*a*, 1311*b*. Supply modulators (A and B) respectively supply modulated voltage signals $V_{SMA}$ and $V_{SMB}$ as inputs to the switching network 1300. Switching network 1300 comprises a first plurality of outputs 1302a-1302N each of which may be coupled to one or more of a second plurality of RF amplifiers (not shown in FIG. 13). In embodiments, the plurality of switching network outputs may be the same as the number of RF amplifiers such that there exists a one-to-one correspondence between the number of switching network outputs and RF amplifiers. In this case, each RF amplifier may be coupled to a respective one of the switching network outputs 1302a-1302N. In the example embodiment of FIG. 13, switching network 1300 is illustrated as providing N outputs 1302a-1302N (where N is any integer greater than 1) at which respective ones of voltages $V_{O1}$, $V_{O2}$, $V_{O3}$, $V_{O4}$, $V_{O5}$, $V_{ON}$ may be provided. The switching network outputs may be coupled to one or more bias terminals (e.g. a supply terminal) of one or more RF power amplifiers and thus output voltages $V_{O1}$, $V_{O2}$, $V_{O3}$, $V_{O4}$, $V_{O5}$, VON may be coupled to a bias terminal of one or more RF power amplifiers. In some embodiments, N may be equal to 2 (thus providing output voltages $V_{O1}$, $V_{O2}$). In some embodiments, N may be equal to 4 (thus providing output voltages $V_{O1}$, $V_{O2}$, $V_{O3}$, $V_{O4}$). In some embodiments, N may be equal to 6 (thus providing output voltages $V_{O1}$, $V_{O2}$, $V_{O3}$, $V_{O4}$, $V_{O5}$, $V_{O6}$). In some embodiments, N may be equal to 8 (thus providing voltages $V_{O1}$, $V_{O2}$, $V_{O3}$, $V_{O4}$, $V_{O5}$, $V_{O6}$, $V_{O7}$, $V_{O8}$). In some embodiments, N may be equal to 10 (thus providing voltages $V_{O1}$, $V_{O2}$, $V_{O3}$, $V_{O4}$, $V_{O5}$, $V_{O6}$, $V_{O7}$, $V_{O8}$, $V_{O9}$, $V_{10}$).

For example, in one embodiment, two or more output ports may be coupled to provide output signals in some cases all N output signals ($V_{O1}$, $V_{O2}$, $V_{O3}$, $V_{O4}$, $V_{O5}$, $V_{ON}$ may be coupled to a bias terminal (e.g. a supply terminal) of a single RF power amplifier. In other embodiments, one or more or each output signal $V_{O1}$, $V_{O2}$, $V_{O3}$, $V_{O4}$, $V_{O5}$, $V_{ON}$ may be coupled to its own, respective, RF power amplifier (i.e., a bias terminal of respective RF amplifiers). And in still other embodiments, one or more output amplifiers may be coupled to a single output terminal of switching network 1300, while other RF output amplifiers may be coupled to two or more output signals of switching network 1300.

The switches $S_1$-$S_{11}$ of switching network 1300 may be coupled to a controller (not shown) that can open and close the switches $S_1$-$S_{11}$ to control the output signals $V_{O1}$, $V_{O2}$, $V_{O3}$, $V_{O4}$, $V_{O5}$, $V_{ON}$. In this way, the switching network 1300 can be coupled across one or more PSN (and in some cases, configured to provide a signal path which bypasses one or more of the PSN). For example, when switch $S_1$ is closed, modulated voltage signal $V_{SMA}$ is coupled to output 1302a at which voltage $V_{O1}$ is provided. When switch S1 is open and switches $S_2$ and $S_3$ are closed, modulated voltage signal $V_{SMA}$ is coupled through PSN 1303 (also referred to as filter network 1303) to output 1302a. And when switches $S_1$ and $S_3$ are open, the output signal $V_{O1}$ at output 1302a is not connected to voltage signal $V_{SMA}$, and may be floating or may be tied to some other potential such as ground by circuitry not shown. Thus, switches $S_1$, $S_2$, and $S_3$ can be used to adaptively (or dynamically) in real time enable or disable filtering (performed by a filter network 1303) for output signal $V_{O1}$. It should be appreciated that filter circuit 1302 may be provided in a variety of different circuit configurations to provide filter characteristics selected to meet the needs of a particular application. Taking filter network (PSN) 1303 illustrative of filter networks 1304-1310, filter network 1303 comprises one or more electronic elements. In the example of FIG. 13 filter network 1303 comprises four electronic elements which are passive circuit elements (also sometimes referred to herein as a "passive component"). Filter networks 1303-1310 may of course comprises any number of passive or active circuit elements selected to suit the needs of a particular application. After reading the disclosure provided herein, one of ordinary skill in the art will understand how to design one or more filter networks to suit the needs of a particular application.

Whether to connect or not a given PSN (e.g. one or more of filter networks 1303-1310) between a supply modulator (e.g. one or more of modulators 1311a, 1311b) and an output (e.g. one of outputs 1302a-1302N) may depend upon a variety of factors including but not limited to: the rf frequency band in which the RF signal provided to the RF input of the power amplifier resides; the bandwidth of the RF signal provided to the RF input of the power amplifier; peak-to-average ratio of the RF signal provided to the RF input of the power amplifier; power level of the RF signal provided to the RF input of the power amplifier; other aspects or characteristics of the RF signal to be provided to the RF input of the PA; the mode of the supply modulation (e.g., digital envelope tracking vs. average power tracking vs. fixed supply) being used; and/or by the characteristics of an operating or application scenario (e.g., observed noise or amplifier behavior) among other factors.

Similarly, when switch $S_4$ is closed, modulated voltage signal $V_{SMA}$ is coupled through filter network 1304 to output 1302b at which voltage $V_{O2}$ is provided. When switch $S_5$ is closed, modulated voltage signal $V_{SMA}$ is coupled through filter network 1306 to output 1302c. And when switch $S_6$ is closed, modulated voltage signal $V_{SMB}$ is coupled through filter network 1306 to output 1302c. Thus, switches $S_5$ and $S_6$ may be used to select which modulated voltage signal $V_{SMA}$ or $V_{SMB}$ (or both in parallel) is coupled to provide an output signal at output 1302c.

When switch $S_7$ is closed, modulated voltage signal $V_{SMB}$ is coupled through filter network 1308 to terminal 1302d is provided. It should be appreciated that one, some or all of filters 1303-1310 may be provided as reconfigurable filters. For example, filter 1308 comprises switch $S_8$. Switch $S_8$ is configured to change the filtering parameters (or characteristics) of filter network 1308. In this case, closing switch $S_8$ creates a short circuit signal path across inductor L8 thereby effectively removing inductor L8 from filter 1308, which will affect the transfer function of filter network 1308. In this way filter characteristics of filter 1308 may be changed (e.g., adaptively changed or "on-the-fly" or in real time) to suit the needs of a particular application or operating scenario. For example, it might be desirable to dynamically adjust the characteristics of the filter depending upon the rf band in which the signal will be transmitted by the power amplifier, by the bandwidth, peak-to-average ratio, power level, or other aspects of the signal to be transmitted, and by the mode of the supply modulation (e.g., digital envelope tracking vs. adaptive power tracking vs. fixed supply) being used, or by the characteristics of an operating or application scenario (e.g., observed noise or amplifier behavior) among other factors.

Switches $S_9$, may be switched between open and closed states to selectively couple modulated voltage signal $V_{SMB}$ through filter 1310 to node 1312. Switches $S_{10}$ $S_{11}$ may be switched between open and closed states to couple node 1312 to either or both of outputs 1302$_{N-1}$, 1302$_N$ at which respective ones of voltages $V_{N-1}$, $V_N$ are provided. When switches $S_9$ and $S_{10}$ are closed, modulated voltage signal $V_{SMB}$ is coupled through filter network 1310 to output 1302N-1 at which voltage $V_{O\ N-1}$ is provided. Similarly, when switches $S_9$ and $S_{11}$ are closed modulated voltage signal $V_{SMB}$ is coupled through filter network 1310 to node 1312 at which voltage $V_{N-1}$ may be provided. When all three switches $S_9$, $S_{10}$, and $S_{11}$ are closed, modulated voltage signal $V_{SMB}$ is coupled through filter network 1310 to both output terminals $1302_{N-1}$ and 1302N.

The signal paths created by switches $S_1$-$S_{11}$ in FIG. 13 are provided as examples. One skilled in the art will recognize that other configurations of signal paths and filtering parameters and characteristics are possible by changing the number, arrangement, and control of the switches in switching network 1300. For example, the switches $S_1$-$S_{11}$ may be operated or controlled (i.e., placed in an open or closed states) such either of modulated voltage signals $V_{SMA}$, $V_{SMB}$ may be coupled to any of terminals 1302*a*-1302N. In general, switches within switching network 1300 may be configured to enable one or more on-die supply modulator output(s) to be routed to one or more power amplifier supply terminals; adjusting filtering of a provided modulator output (e.g., to provide a reconfigurable pulse shaping network); reconfigure how different (possibly spatially separated) filter stages are utilized in connecting one or more modulator outputs via one or more filter stages to one or more RF amplifiers; and turn-off switch(es) to enable a supply modulator output to be disconnected from a power amplifier and/or filter, or perform other tasks that modify and/or control the output signals that provide power to RF power amplifiers.

The particular manner in which the switching network 1300 is realized may depend upon the power level, voltage level and application space of the system in which the switching network is being used (e.g., an RF amplifier system). For some mobile device applications (e.g. a cellular phone, smart phone, tablet PC with cellular communication capabilities) it may be desirable to monolithically integrate electronic elements (e.g. circuit components) of both the supply generator and supply modulator and switching elements as well as portions of the ancillary circuits on a single semiconductor die (e.g., in a CMOS or BCD process) or IC. In some cases it may be desirable to integrate electronics such as the modulator(s) and switching network 1300 together with power amplifiers on a single die. Moreover, in some cases it may be advantageous to package the modulator, switches and some of the filter components within a single module and locate other filter components and the RF amplifier in a physically separated location. In still other applications it may be advantageous to package the modulator and some switches on a first die, and further switches on at least one additional die that is placed a relative distance from the first die. This second die may also contain one or more power amplifiers or be located physically close to power amplifier(s), e.g., in a module or co-located on a circuit board. In these latter cases, the switches on the first die can be used for some of the functions described above and may be placed close to one or more first filter stages, while the second die can also implement some of the functions described above and may be placed closer to one or more second filter stages. Communication lines may also be provided between the first die and the second die (or between a controller and the second die) to allow the configuration to be changed.

Figure 14:
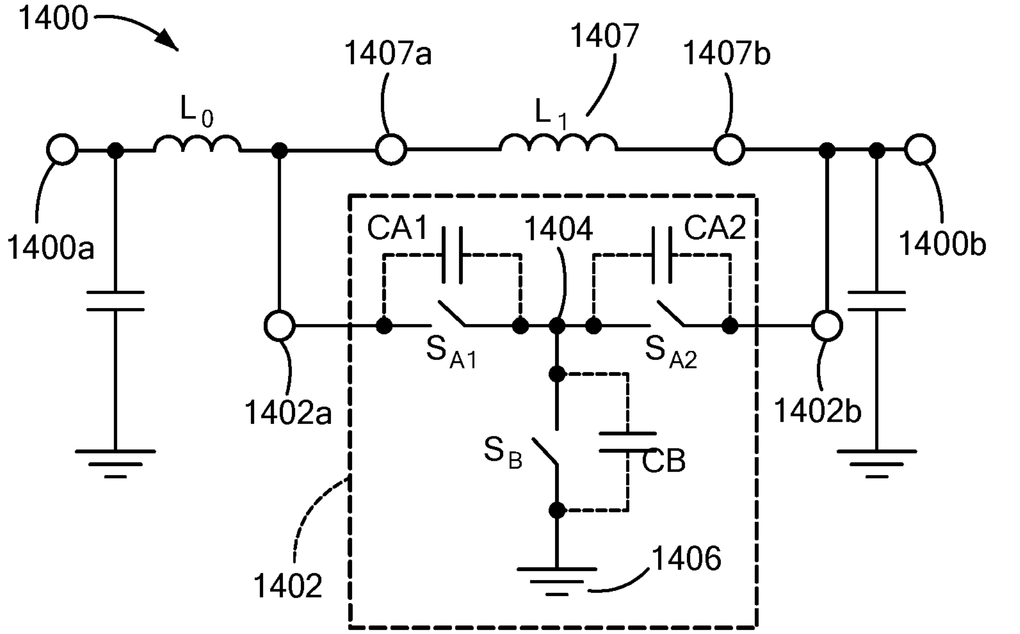
FIG. 14 is a schematic diagram of a configurable filter network.

Referring now to FIG. 14, a configurable filter network 1400 has an input terminal 1400*a* configured to receive a signal and an output terminal 1400*b* at which a filtered output signal may be provided. The filter network 1400 includes a switch network 1402 which comprises one or more switches which can be operated (i.e., changed between their closed (or "ON") and open (or "OFF") states) to change the filter characteristics of the configurable filter network. Switch network 1402 can thus operate in two states: (a) a first (or ON) state in which configurable filter network 1400 has a first filter characteristic; (b) and a second (or OFF) state in which configurable filter network 1400 has a second, different filter characteristic.

In this example embodiment, configurable filter network 1400 has a pair of capacitors $C_{A1}$, $C_{A2}$ which may represent the parasitic output capacitances of switches $S_{A1}$ and $S_{A2}$ and a pair of inductors $L_0$ $L_1$ 1407 and a switch network 1402 comprising three switches $S_{A1}$, $S_{A2}$, and $S_B$ that can be used to configure the filter network 1400. When switches $S_{A1}$ and $S_{A2}$ are off and switch $S_B$ is on, capacitors $C_{A1}$ and $C_{A2}$ form a pi network with inductor $L_1$ 1407, in some implementations, with the capacitors $C_{A1}$ and $C_{A2}$ providing a relatively low capacitance across the inductor $L_1$ 1407. The switches $S_{A1}$, $S_{A2}$, and $S_B$ are arranged within the circuit 1400 so that, when switches $S_{A1}$ and $S_{A2}$ are closed, a signal path having a low impedance characteristic (and ideally a short circuit impedance characteristic) exist between terminals 1402*a*, 1402*b* (and thus across terminals 1407*a*, 1407*b* of inductor $L_1$ 1407). This signal path thus bypasses inductor $L_1$ 1407. This change in circuit configuration (i.e., adding a circuit path which removes (in an electrical sense) inductor $L_1$ 1407 from the filter network 1400) alters the filter network's transfer function by effectively removing inductor $L_1$ 1407 from the filter network (i.e., inductor $L_1$ 1407 does not contribute to the characteristics of filter 1400).

Conversely, when switches $S_{A1}$ and $S_{A2}$ are open, a signal path having a high impedance characteristic (and ideally an open circuit impedance characteristic) exist between terminals 1402*a*, 1402*b* (and thus across inductor terminals 1407*a*, 1407*b*) and thus inductor $L_1$ is included in the filter network 1400 (i.e., inductor $L_1$ contributes to the characteristics of filter 1400).

Each switch $S_{A1}$, $S_{A2}$, and $S_B$ has an associated parasitic capacitance. As illustrated in FIG. 14, the parasitic capacitances are illustrated as capacitors designated, respectively, as $C_{A1}$, $C_{A2}$, and $C_B$. In the example embodiment of FIG. 14, the three switches $S_{A1}$, $S_{A2}$, and $S_B$ are arranged in a T-configuration (a so-called "T-network"), where switches $S_{A1}$ and $S_{A2}$ are coupled such that each switch $S_{A1}$, $S_{A2}$ has a terminal coupled to a node 1404 (i.e., a shared or common node), and switch $S_B$ has a first terminal coupled to common node 1404 and a second terminal coupled to a reference potential (in this case ground) at a node 1406. When switches $S_{A1}$, $S_{A2}$ are open switch $S_B$ is closed to thereby couple node 1404 to the reference potential. In this way, the T-configuration of switches may mitigate effects of the parasitic capacitances of the switches $S_{A1}$, $S_{A2}$, in bypassing inductor $L_1$ 1407. This is desirable in some embodiments since the parasitic capacitances of the switches $S_{A1}$, $S_{A2}$, may otherwise adversely affect the characteristics of the filter 1400.

It should, of course, be appreciated that in embodiments in which capacitive coupling is not a concern, the T-network may be replaced by another arrangement of switches (i.e., switch configurations other than T-configurations). After reading the disclosure provided herein, one of ordinary skill in the art will appreciate how to select switch configuration(s) to meet the needs of a particular application.

If either or both of switches $S_{A1}$ and $S_{A2}$ are open, a low impedance signal path is not formed across inductor terminals 1407*a*, 1407*b* and inductor $L_1$ is effectively inserted in the filter circuit. That is, inductor $L_1$ contributes to the filter characteristics of filter 1400. However, the parasitic capacitances $C_{A1}$ and $C_{A2}$ may form a "bridge" across the open switches and affect the filter's transfer function (i.e., affect one or more electrical characteristics of filter 1400). To reduce (and ideally minimize or even prevent), parasitic capacitances $C_{A1}$ and $C_{A2}$ from affecting the characteristics of filter 1400, switch $S_B$ may be closed.

Closing the switch $S_B$ couples node 1404 to ground so that the parasitic capacitances $C_{A1}$ and $C_{A2}$ do not form a bridge that affects characteristics of the filter network 1400.

Because a switch network having a T configuration removes the effects of the switch's parasitic capacitance from bridging the filter inductor $L_1$, this approach results in filter performance which is improved compared with the filter performance of networks in which a single switch is used to provide a low impedance signal path (and ideally, a short circuit signal path) across inductor $L_1$. Furthermore, in embodiments, the switches $S_{A1}$, $S_{A2}$, and/or $S_B$ may be unidirectional voltage blocking switches.

This is in contrast to some single-switch implementations in which a single switch may need to provide bidirectional voltage blocking capability.

In general, a T-network of switches can be used to short or otherwise bypass a circuit element within a filter network to thereby provide the filter network as a configurable filter network. For example, switches within the configurable filter network are arranged and operable to effectively bypass or include inductor $L_1$ in the filter so as to change the filter characteristics of the configurable filter. The T-network is configured so that two switches ($S_{A1}$ and $S_{A2}$) are coupled between first and second terminals of a circuit element to be bypassed (e.g., across inductor terminals 1407*a*, 1407*b* in the example embodiment of FIG. 14). Thus, the switches may be thought of as being in a signal path which is across the circuit element. By appropriately controlling the switches, the signal path may be provided having an open circuit impedance or a short circuit impedance. The third switch ($S_B$) is coupled to a node formed between the two serially coupled switches (i.e. $S_{A1}$, $S_{A2}$) and a reference node such as ground. In this document, when a T-network is "closed," it means that the two series switches (i.e. $S_{A1}$ and $S_{A2}$) are closed and the third switch ($S_B$) is open. In this state, the T-network acts like a closed switch. When a T-network is referred to as "open," it means the two series switches (i.e. $S_{A1}$ and $S_{A2}$) are open, and the third switch ($S_B$) is closed. In this state, the T-network acts like an open switch.

Figure 15:
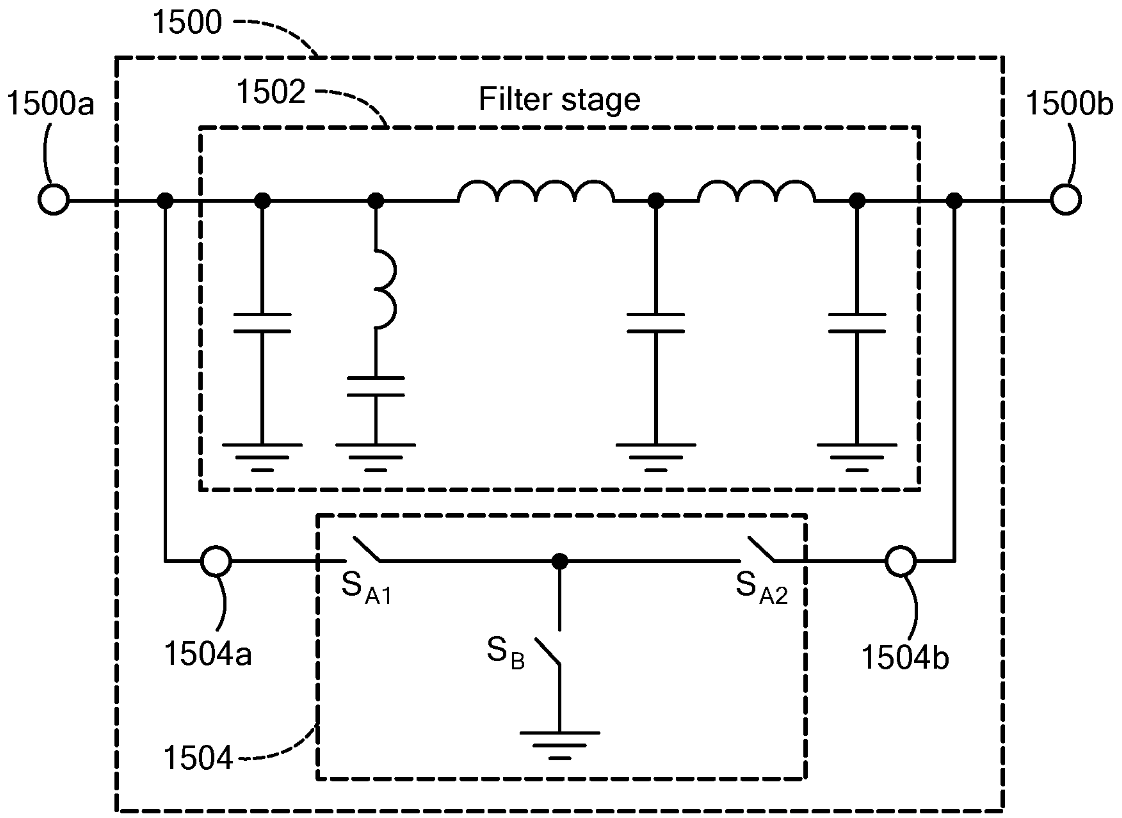
FIG. 15 is a schematic diagram of a filter network that can be bypassed by a T-network of switches.

Referring now to FIG. 15, a configurable filter network 1500 (which may also be referred to as a configurable PSN 1500) having first and second terminals 1500*a*, 1500*b* comprises a filter (or PSN) stage 1502 and a switch stage 1504 having first and second terminals 1504*a*, 1504*b* (switch stage may also sometimes be referred to herein as a configuration switch network). Switch stage 1504 comprises a plurality of switches, here three switches, coupled in a T-configuration. Switch network 1504 has a first terminal 1504*a* coupled to a first one 1500*a* of the first and second terminals of the configurable filter network 1500 and a second terminal 1504*b* coupled to a second one 1500*b* of the first and second terminals of configurable filter network 1500. Switch network 1504 is thus coupled such that filter stage 1502 can be bypassed by a T-network of switches. It is noteworthy that T-network of switches 1504 can be used to reduce noise injection and noise bypass in a variety of cases. In addition to its use inserting and removing individual filter elements (e.g., such as inductor L1 in FIG. 14), as illustrated in FIG. 15, configuration switch network can be used to include or bypass (or "short out") one or more entire filter stages with a single filter stage 1500 being illustrated in FIG. 15. In the example of FIG. 15, filter stage 1500 may be configured to provide high-frequency attenuation. Because of this, parasitic capacitance appearing (or "bridging") across a switch that is used to bypass the filter state 1500 can impact its performance. As described above with respect to FIG. 14, a T-network of switches 1504 reduces the effect of the parasitic capacitance of the switches on filter performance when the filter stage is in use (i.e., when switches $S_{A1}$ and $S_{A2}$ are open, and switch $S_B$ is closed).

Figure 16:
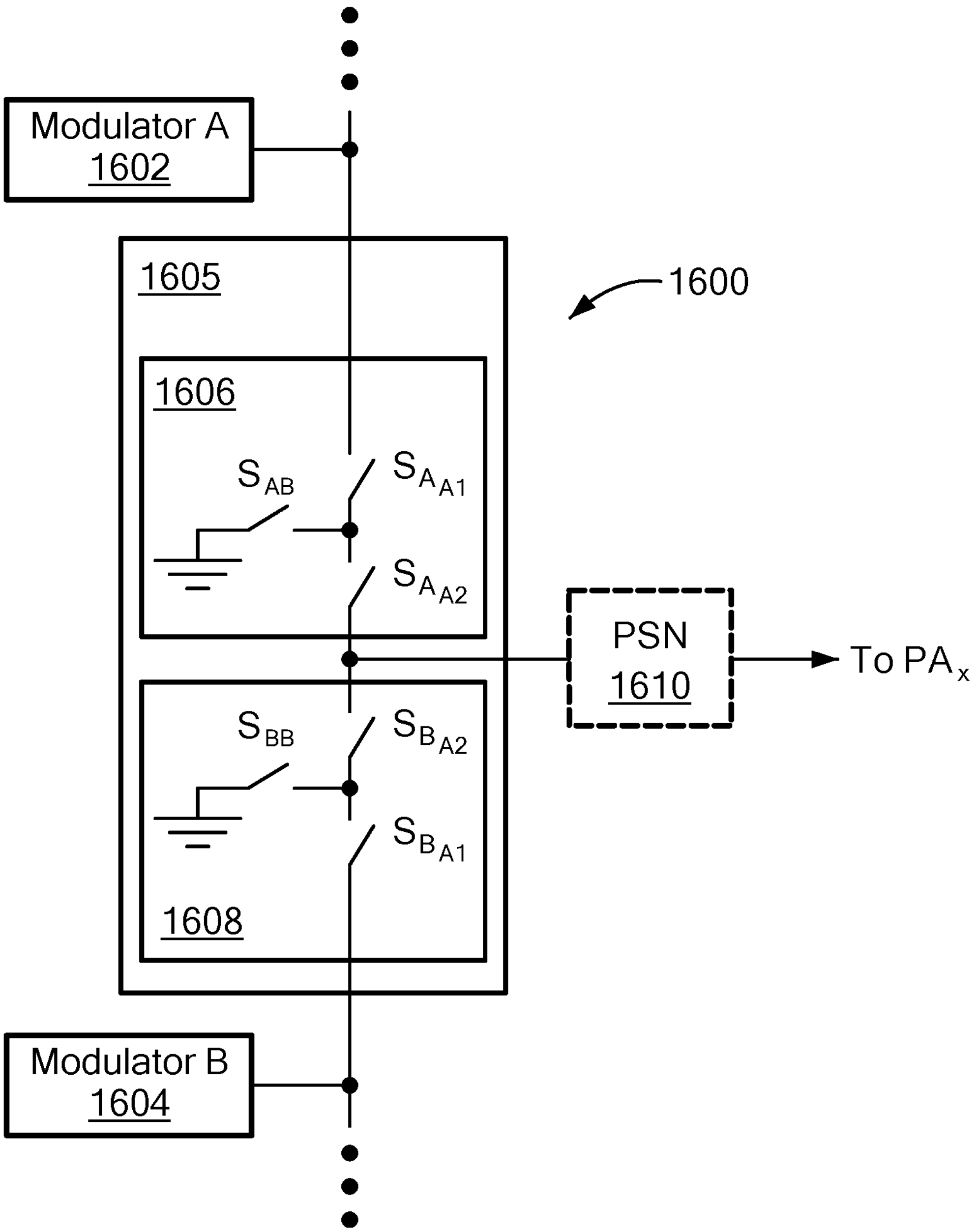
FIG. 16 is a schematic diagram of modulated RF power circuit that includes one or more T-networks of switches to isolate one or more power modulators.

Referring now to FIG. 16, a supply modulator circuit 1600 comprises at least one supply modulator circuit (or simply "supply modulators" or more simply "modulators") and at least one configuration switch network. In this example embodiment, shown are a pair of supply modulators 1602, 1604 and a configuration switch network 1605 which may include one or more switches (e.g., one or a plurality of switches) including one or more T-network of switches. In this example embodiment, configuration switch network 1605 comprises a pair of T-network of switches 1606,1608 coupled to isolate one or more of the supply modulators 1602, 1604. Circuit 1600 may optionally comprise a PSN 1610 coupled between supply modulators 1602, 1604 and an RF amplifier (not explicitly shown in FIG. 16) such as an RF power amplifier (PA). Thus, signals may be coupled from one or more modulators to one or more PAs (e.g. PA1-$PA_x$, where X is an integer greater than 1) through a configuration switch network such as configuration switch network 1605 and a PSN (e.g., PSN 1610).

In this example embodiment, the PSN 1610 may be selectively coupled to either or both of supply modulator circuits 1602, 1604 via the configuration switch network 1605. In particular, in this example embodiment, a T-network of switches 1606 is coupled between power supply modulator circuit 1602 and PSN 1610. Similarly, coupled between supply modulator circuit 1604 and PSN 1610 is a second T-network of switches 1608. T-networks 1606, 1608 can be used to select which supply modulator circuit will be coupled to PSN 1610. Thus, either or both of supply modulator circuits 1602, 1604 may be coupled to and thus provide modulated signals (e.g., voltage signals) to an input of the PSN 1610.

For example, to couple supply modulator circuit 1602 to PSN 1610, switches $S_{AA1}$ and $S_{AA2}$ in T-network 1606 may be closed (in which case switch $S_{AB}$ is open), and switches $S_{BA1}$ and $S_{BA2}$ in T-network 1608 may be open (in which case switch $S_{BB}$ is closed). Alternatively, to couple PSN 1610 to supply modulator circuit 1604, switches $S_{BA1}$ and $S_{BA2}$ in T-network 1608 may be closed, and switches $S_{AA1}$ and $S_{AA2}$ in T-network 1606 may be open.

In other configurations, both supply modulators 1606 and 1608 may provide modulated power to PSN 1610 (and subsequently to power amplifiers) in parallel. In this case, switches $S_{AA1}$ and $S_{AA2}$ and switches $S_{BA1}$ and $S_{BA2}$ in respective T-networks 1606 and 1608 may be closed (in which case switches $S_{AB}$, $S_{BB}$ are open). Thus, in some embodiments, multiple supply modulators may be configured to operate in a synchronous mode to source current in parallel to the same PA. By combining multiple supply modulators in parallel, a reduced overall supply modulator resistance may be achieved.

Figure 17:
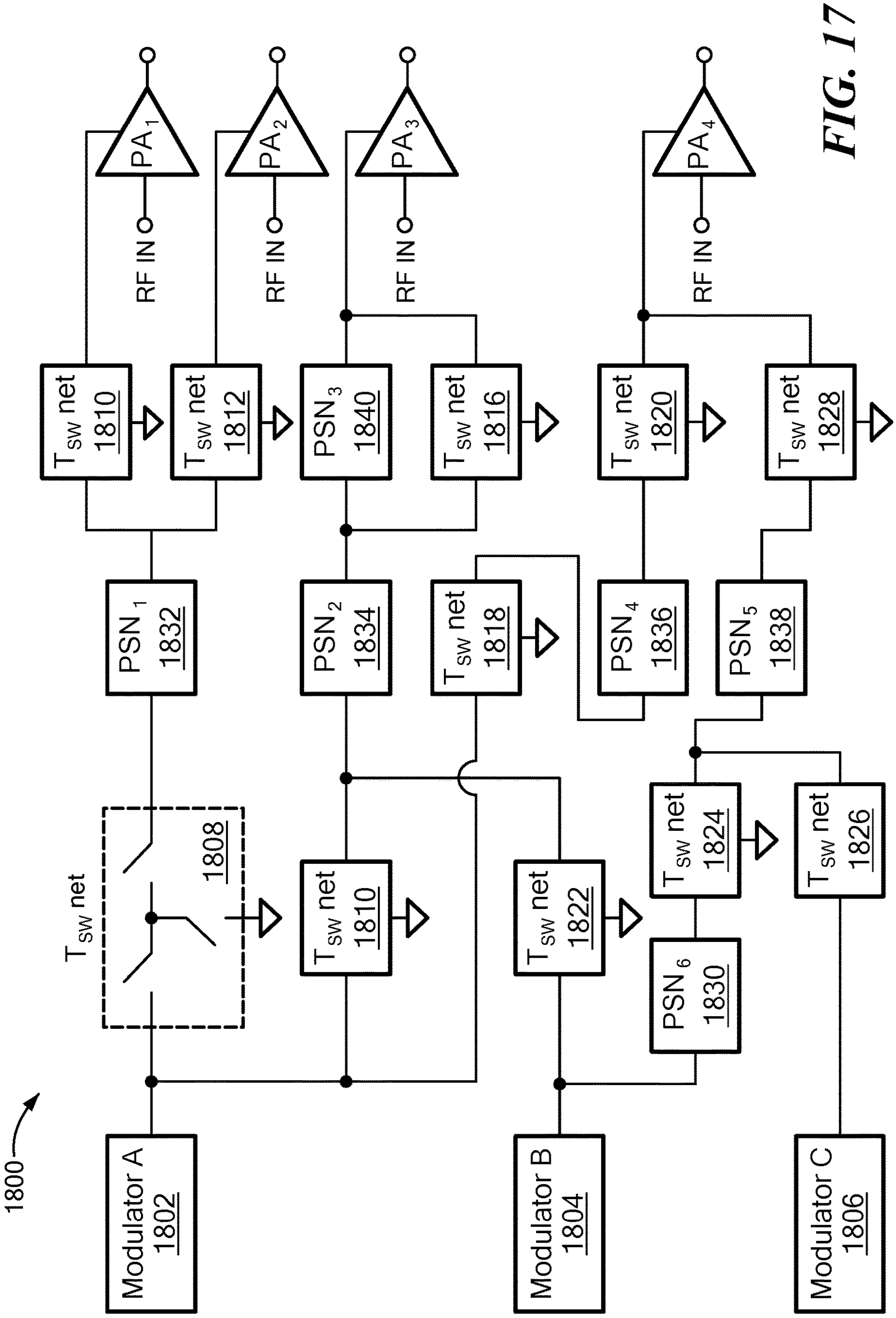
FIG. 17 is a block diagram of a configurable power modulation circuit that provides power to a plurality of power amplifiers.

Referring now to FIG. 17, a configurable supply modulation circuit 1800 provides power to a plurality of power amplifiers. Four power amplifiers $PA_1$-$PA_4$ are shown here. In general, a configurable power modulation circuit comprises one or more supply modulators, one or more switch networks having a T-configuration (so-called "T-networks of switches") and one or more PSNs. In embodiments, the one or more supply modulators, the one or more T-networks of switches and the one or more PSNs may be provided as separate components (e.g., components or devices on separate integrated circuits (ICs) or on separate IC dies coupled via signal paths therebetween). In embodiments, the one or more supply modulators, the one or more T-networks of switches and the one or more PSNs may be provided on a single IC (e.g., a monolithic IC or a single IC die) coupled via signal paths included directly on the IC or the IC die during a fabrication process.

In the example embodiment of FIG. 17, circuit 1800 includes three (3) supply modulators 1802, 1804, 1806; eleven (11) T-networks of switches 1808-1828, and six (6) PSNs 1830-1840. One skilled in the art will recognize that by opening and closing ones of the T-networks of switches 1808-1828, various signal paths may be created between ones of the supply modulators and the power amplifiers.

For example, closing T-network 1808 and T-network 1810 and opening T-network 1812 couples supply modulator 1802 to PA1 through PSN 1832. Similarly, closing T-network 1808, T-network 1810 and T-network 1812 couples supply modulator 1802 to both PA1 and PA2 through PSN 1832.

In addition to operating T-networks 1808, 1810, 1812 as described above, closing T-network 1814 couples supply modulator 1802 to PA3 through PSNs 1834, 1840. Furthermore, closing T-network 1816 bypasses PSN 1840 ($PSN_3$) in the signal path between supply modulator 1802 and RF amplifier $PA_3$. It should be appreciated that PSN stage 1834 has a first frequency response, PSN stage 1840 has a second frequency response, and the cascade of both produce a third frequency response. By bypassing stage 1840 it is possible to switch from the cascaded response to only the response of 1834. Shorting a stage gives flexibility to achieve a different response. The response that should be used (e.g. whether or not to bypass stage 1840 or any other stage or component) is determined by the needs and/or requirements of a particular application and/or operating conditions (including, but not limited to, for example bandwidth, band of operation, RF requirements).

In addition to operating T-networks 1808, 1810, 1812, 1814, 1816 as described above, closing T-networks 1818 and 1820 couples supply modulator 1802 to PA4 through PSN 1836. Thus, by selectively opening and closing ones of T-networks 1808-1820, supply modulator 1802 may be coupled to one, some or all of RF amplifiers $PA_1$-$PA_4$.

Similarly, by opening and closing selected ones of T-networks 1808-1828, supply modulator 1804 may be coupled to one, some or all of amplifiers $PA_1$-$PA_4$.

Similarly, by opening and closing selected ones of T-networks 1808-1828, supply modulator 1806 may be coupled to one, some or all of amplifiers $PA_1$-$PA_4$.

Additionally, as can now be understood from the above description, two or more of supply modulators 1802, 1804, 1806 can be concurrently coupled to one of more of RF amplifiers $PA_1$-$PA_3$.

Figure 18:
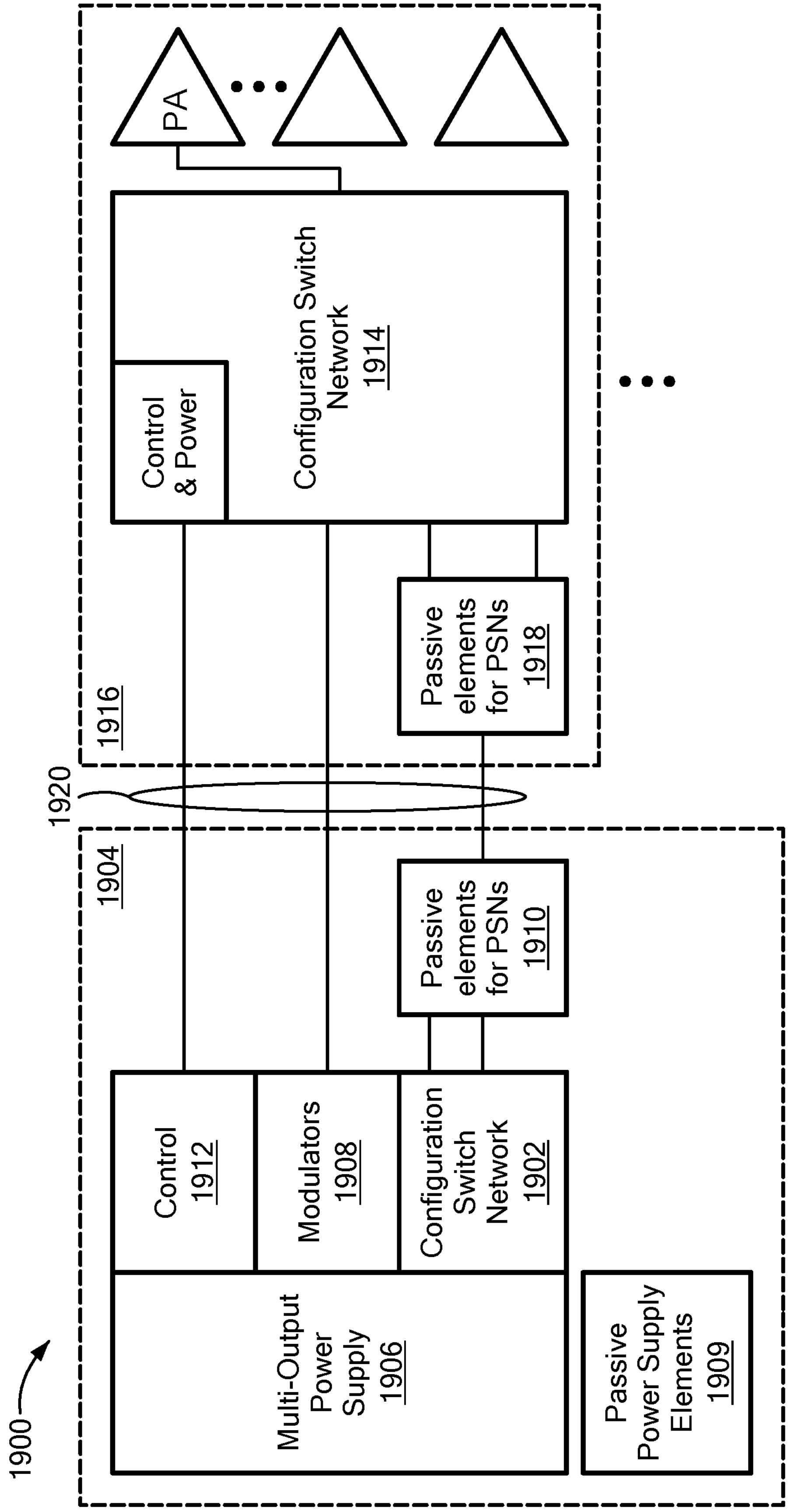
FIG. 18 is a block diagram of a physical configuration of an RF power modulation circuit that includes multiple integrated circuit dies.

One of ordinary skill in the art will recognize that various other signal paths can be created by opening and closing the T-switch networks in FIG. 18. It will be appreciated that the shown configurations are only representative some of the many possible circuit configurations that might be used. After reading the disclosure provided herein. One of ordinary skill in the art will appreciate how to select a configuration of modulators, switch networks and PSNs to suit the needs of a particular application. Although the example embodiment of FIG. 17 illustrates switches implemented in a T-configuration, as noted above, one or more of the T-networks in FIG. 17 may be replaced by another switch implementation in scenarios where capacitive coupling is not a concern.

Referring now to FIG. 18, shown is a block diagram of an example physical configuration of an RF power modulation circuit 1900 that includes multiple integrated circuit dies. In this example, a configuration switch network 1902 may be provided on a first integrated circuit (IC) die 1904. The first die may also include a multi-output power supply 1906 (which may be the same as or similar to multi-output power supply 1252 in FIG. 12B) and one or more power modulator circuits 1908 (or more simply modulator circuits or modulators) which may be the same as or similar to power modulator circuit 1254 in FIG. 12B. One or more switches within configuration switch network 1902 may operate (i.e. place in their ON/OFF states) to configure various signal paths to couple the multi-output power supply output signals to various inputs of modulators and/or PSNs. In embodiments, configuration switch network 1902 may comprise one or more T-networks of switches.

Passive power supply elements 1909 such as capacitors, inductors, and resistors associated with the multi-output power supply 1906 may also be located on or near die 1904 (with "near" meaning in physical proximity such that inductance, capacitance and resistance characteristics of any signal path coupling one or more of elements 1909 (including parasitic inductance, capacitance and resistance characteristics) do not substantially effect operation of all or portions of power modulation circuit 1900) and/or do not substantially increase the size of IC 1904).

Passive elements 1910 (e.g. capacitors, inductors, resistors) that comprise any PSNs may also be located on or near die 1904 (with "near" meaning in physical proximity such that inductance, capacitance and resistance characteristics of any signal path coupling one or more of elements 1910 (including parasitic inductance, capacitance and resistance characteristics) do not substantially affect operation of all or portions of power modulation circuit 1900) and/or do not substantially increase the size of IC 1904).

A control circuit 1912 may also be included on IC die 1904. Control circuit 1912 may be disposed to control (e.g., provide control signals to) one or more of the configuration switch network switches, the power modulator circuits, or other circuits. For example, control circuit 1912 may provide one or more control signals to one or more switches within configuration switch network to set and/or change a state of the switch between its closed (or "on") and open (or "off") state.

A second configuration switch network 1914 (which may include one or more T-networks) may be located on one or more second integrated circuit dies 1916. Additional passive elements 1918 that may comprise PSNs may also be located on or near the one or more second dies 1916. Optionally, power amplifier circuits PA may also be located on or near the one or more second integrated circuit dies 1916. One or more signal lines 1920 may carry control signals, communication signals, power signals, RF signals and the like between the dies 1904, 1916.

Die 1904, the one or more dies 1916, or both may be implemented in a CMOS process, a BCD process, an SOI process, a GaAs process, etc. One or more power amplifiers may also be placed physically close to the one or more second dies 1916 or may optionally be physically implemented on the one or more second dies 1916. The one or more second dies 1916 be placed together in a module with passive components and/or with one or more power amplifiers. Additional PSN stages or passive elements may be physically separated from die 1904, the one or more second dies 1916, or both. These elements may still be electrically coupled to die 1904, the one or more second dies 1916, or both.

In the description above, various concepts, circuits, and techniques are discussed in the context of discrete supply modulation system for use with RF transmitters that are operative for transmitting signals via a wireless medium. The concepts, circuits and techniques described herein are appropriate for use in handsets (e.g. mobile handsets) operating in accordance with 6G, communication protocols, 5G communication protocols and other connectivity protocols such as 802.11 a/b/g/n/ac/ax/ad/ay and are also appropriate for use in multi-transmitter applications including, but not limited to, MIMO, uplink carrier aggregation (ULCA), and beamforming applications. It should be appreciated that these concepts, circuits, and techniques also have application in other contexts. For example, in some implementations, features described herein may be implemented within transmitters or drivers for use in wireline communication. In some other implementations, features described herein may be implemented within other types of systems that require highly efficient and highly linear power amplification for data carrying signals.

Various embodiments of the concepts, systems, devices, structures, and techniques sought to be protected are described above with reference to the related drawings. Alternative embodiments can be devised without departing from the scope of the concepts, systems, devices, structures, and techniques described. It is noted that various connections and positional relationships (e.g., over, below, adjacent, etc.) may be used to describe elements in the description and drawing. These connections and/or positional relationships, unless specified otherwise, can be direct or indirect, and the described concepts, systems, devices, structures, and techniques are not intended to be limiting in this respect. Accordingly, a coupling or connection of entities can refer to either a direct or an indirect coupling or connection.

As an example of an indirect coupling relationship, element "A" coupled to element "B" can include situations in which one or more intermediate elements (e.g., element "C") is between elements "A" and elements "B" as long as the relevant characteristics and functionalities of elements "A" and "B" are not substantially changed by the intermediate element(s).

Also, the following definitions and abbreviations are to be used for the interpretation of the claims and the specification. The terms "comprise," "comprises," "comprising," "include," "includes," "including," "has," "having," "contains" or "containing," or any other variation are intended to cover a non-exclusive inclusion. For example, an apparatus, a method, a composition, a mixture or an article, that comprises a list of elements is not necessarily limited to only those elements but can include other elements not expressly listed or inherent to such apparatus, method, composition, mixture, or article.

Additionally, the term "exemplary" is means "serving as an example, instance, or illustration. Any embodiment or design described as "exemplary" is not necessarily to be construed as preferred or advantageous over other embodiments or designs. The terms "one or more" and "at least one" indicate any integer number greater than or equal to one, i.e. one, two, three, four, etc. The term "plurality" indicates any integer number greater than one. The term "connection" can include an indirect "connection" and a direct "connection".

References in the specification to "embodiments," "one embodiment, "an embodiment," "an example embodiment," "an example," "an instance," "an aspect," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it may affect such feature, structure, or characteristic in other embodiments whether or not explicitly described.

Relative or positional terms including, but not limited to, the terms "upper," "lower," "right," "left," "vertical," "horizontal, "top," "bottom," and derivatives of those terms relate to the described structures and methods as oriented in the drawing figures. The terms "overlying," "atop," "on top, "positioned on" or "positioned atop" mean that a first element, such as a first structure, is present on a second element, such as a second structure, where intervening elements such as an interface structure can be present between the first element and the second element. The term "direct contact" means that a first element, such as a first structure, and a second element, such as a second structure, are connected without any intermediary elements.

Use of ordinal terms such as "first," "second," "third," etc., in the claims to modify a claim element does not by itself connote any priority, precedence, or order of one claim element over another, or a temporal order in which acts of a method are performed, but are used merely as labels to distinguish one claim element having a certain name from another element having a same name (but for use of the ordinal term) to distinguish the claim elements.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value. The term "substantially equal" may be used to refer to values that are within ±20% of one another in some embodiments, within ±10% of one another in some embodiments, within ±5% of one another in some embodiments, and yet within ±2% of one another in some embodiments.

The term "substantially" may be used to refer to values that are within ±20% of a comparative measure in some embodiments, within ±10% in some embodiments, within ±5% in some embodiments, and yet within ±2% in some embodiments. For example, a first direction that is "substantially" perpendicular to a second direction may refer to a first direction that is within ±20% of making a 90° angle with the second direction in some embodiments, within ±10% of making a 90° angle with the second direction in some embodiments, within ±5% of making a 90° angle with the second direction in some embodiments, and yet within ±2% of making a 90° angle with the second direction in some embodiments.

The disclosed subject matter is not limited in its application to the details of construction and to the arrangements of the components set forth in the following description or illustrated in the drawings. The disclosed subject matter is capable of other embodiments and of being practiced and carried out in various ways.

Also, the phraseology and terminology used in this patent are for the purpose of description and should not be regarded as limiting. As such, the conception upon which this disclosure is based may readily be utilized as a basis for the designing of other structures, methods, and systems for carrying out the several purposes of the disclosed subject matter. Therefore, the claims should be regarded as including such equivalent constructions insofar as they do not depart from the spirit and scope of the disclosed subject matter.

Although the disclosed subject matter has been described and illustrated in the foregoing exemplary embodiments, the present disclosure has been made only by way of example. Thus, numerous changes in the details of implementation of the disclosed subject matter may be made without departing from the spirit and scope of the disclosed subject matter.

Accordingly, the scope of this patent should not be limited to the described implementations but rather should be limited only by the spirit and scope of the following claims.

All publications and references cited in this patent are expressly incorporated by reference in their entirety.

The invention claimed is:

1. In a mobile handset, a circuit having an input and an output, the circuit comprising:

a filter network having first and second terminals; and a switching network having an input coupled to the input of the circuit and having an output, the switching network comprising:

one or more switches coupled to the filter network and configured such that in a first state the switching network provides a first signal path having a first filter configuration between the input of the circuit and the output of the circuit and in a second state the switching network provides a second signal path having a second, different filter configuration between the input of the circuit and the output of the circuit, wherein at least one of the one or more switches is coupled between an output of a supply modulator and the input of the filter network.

2. The circuit of claim 1, wherein the filter network is provided as a pulse shaping network (PSN) configured to filter a modulated power signal provided thereto, the pulse shaping network having at least one passive component.

3. The circuit of claim 1 wherein the switching network is coupled across the filter network and configured to selectively short the filter network.

4. The circuit of claim 1 wherein the switching network is coupled across at least one electronic element of the filter network and configured to alter a transfer function of the filter network by selectively shorting the at least one electronic element.

5. The circuit of claim 1 wherein the switching network is coupled between the input of the circuit and the output of the circuit to electrically connect or disconnect the input of the circuit from the output of the circuit.

6. The circuit of claim 1 wherein the switching network comprises a plurality of switches and at least a first set of the plurality of switches are located on a first integrated circuit die and at least a second set of the plurality of switches are located on a second, different integrated circuit die.

7. The circuit of claim 1, wherein the switching network comprises a plurality of switches, and wherein at least some of the plurality of switches in the switching network are coupled in a T-configuration.

8. The circuit of claim 7, wherein the T-configuration of switches is coupled across the filter network and configured to selectively short the filter network.

9. The circuit of claim 7 wherein the T-configuration of switches is coupled across at least one electronic element of the filter network and configured to alter a transfer function of the filter network by selectively shorting the at least one electronic element.

10. The circuit of claim 7, wherein the T-configuration of switches is coupled between the input of the circuit and the output of the circuit to electrically connect or disconnect the input of the circuit from the output of the circuit.

* * * * *